(12) United States Patent
Carey

(10) Patent No.: US 10,715,150 B1
(45) Date of Patent: Jul. 14, 2020

(54) INDUCTOR-LESS DIVIDE-BY-3 INJECTION LOCKED FREQUENCY DIVIDER

(71) Applicant: Xilinx, Inc., San Jose, CA (US)

(72) Inventor: Declan Carey, Douglas (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/274,145

(22) Filed: Feb. 12, 2019

(51) Int. Cl.
*H03B 19/12* (2006.01)
*H03K 21/10* (2006.01)
*H03K 21/02* (2006.01)

(52) U.S. Cl.
CPC .............. *H03K 21/10* (2013.01); *H03B 19/12* (2013.01); *H03K 21/026* (2013.01)

(58) Field of Classification Search
CPC ...... H03B 19/12; H03K 21/02; H03K 21/026; H03K 21/08; H03K 21/10
USPC .......................................... 327/115, 117, 118
See application file for complete search history.

(56) References Cited

U.S. PATENT DOCUMENTS

| 7,298,184 | B2 * | 11/2007 | Angel | .................. | H03K 23/667 327/115 |
| 2011/0187469 | A1 * | 8/2011 | Okada | ...................... | H03B 5/12 331/117 FE |
| 2014/0266471 | A1 * | 9/2014 | Zhu | .......................... | H03L 7/00 331/16 |

OTHER PUBLICATIONS

Dehghani, CMOS Injection-Locked Frequency Divider with Division Factor of Three, IET Journals—The institution of Engineering and Technology, IET Circuits, Devices & Systems, vol. 10, Issue 1, pp. 68-77, 2016.

Lo et al., A 1.8V, Sub-mW, Over 100% Locking Range, Divide-by-3 and 7 Complementary-Injection-Locked 4 GHz Frequency Divider, Analog Mixed-Signal Center, Department of Electrical and Computer Engineering, Texas A&M University, IEEE Custom Integrated Circuits Conference, pp. 259-262, 2009.

Yi et al., Design of Ring-Oscillator-Based Injection-Locked Frequency Dividers with Single-Phase Inputs, IEEE Microwave and Wireless Components Letters, vol. 21, No. 10, pp. 559-561, Oct. 2011.

Yu et al., 0.6mW 6.3 GHz 40nm CMOS Divide-by-2/3 Prescaler Using Heterodyne Phase-Locking Technique, Electronics Letters, vol. 49, No. 7, 2-pages, Mar. 28, 2013.

Motoyoshi et al., 43μW 6GHz CMOS Divide-by-3 Frequency Divider Based on Three-Phase Harmonic Injection Locking, School of Engineering, The University of Tokyo, IEEE, pp. 183-186, 2006.

(Continued)

*Primary Examiner* — William Hernandez

(74) *Attorney, Agent, or Firm* — Paradice and Li LLP

(57) ABSTRACT

A frequency divider circuit includes an oscillator comprising a plurality of delay elements coupled in series with each other, a first coupling circuit coupled to a first oscillator node and including a control terminal to receive a first retiming signal, and a first multiplexer including inputs coupled to receive the input signal and a complementary input signal, a control terminal coupled to a second oscillator node, and an output to provide the first retiming signal. The first multiplexer may be configured to alternate between injecting the input signal into the first oscillator node based on rising edges of the input signal and injecting the input signal into the first oscillator node based on falling edges of the input signal in response to a logic state of an oscillation waveform appearing at the second oscillator node.

18 Claims, 10 Drawing Sheets

(56) References Cited

OTHER PUBLICATIONS

Hara et al., 10MHz to 7GHz Quadrature Signal Generation Using a Divide-by-4/3, -3/2, -5/3, -2, -5/2, -3, -4, and -5 Injection-Locked Frequency Divider, Dept. Physical Electronics, Tokyo Institute of Technology, Symposium on VLSI Circuits/Technical Digest of Technical Papers, IEEE, pp. 51-52, 2010.

Jang et al., Enhanced Locking Range Technique for Divide-by-3 Differential Injection-Locked Frequency Divider, Electronics Letters, vol. 51, No. 6, pp. 456-458, Mar. 19, 2015.

Lai et al., A Multi Band Injection Lock Frequency Divider by 3 for Wireless Communication Applications, Dept. of Electronic Engineering, National Taiwan University Science and Technology, IEEE, pp. 588-590, 2017.

Lee et al., Current-Reused Divide-by-3 Injection-Locked Frequency Divider in 65 nm CMOS, Electronic Letters, vol. 47, No. 18, 2-pages, Sep. 1, 2011.

Jang et al., A 90 nm CMOS LC-Tank Divide-by-3 Injection-Locked Frequency Divider With Record Locking Range, IEEE Microwave and Wireless Components Letters, vol. 20, No. 4, pp. 229-231, Apr. 2010.

\* cited by examiner

INDUCTOR-LESS DIVIDE-BY-3 INJECTION LOCKED FREQUENCY DIVIDER

TECHNICAL FIELD

Aspects of the present disclosure relate generally to frequency dividers, and specifically to injection locked frequency dividers.

BACKGROUND

Frequency dividers may generate lower-frequency signals from higher-frequency signals. Some frequency dividers may generate an output clock having a frequency that is equal to 1/N times the frequency of an input clock, where N is an integer greater than 1. Some frequency dividers may propagate an input signal through a series of flip-flops that are clocked on rising edges of a clock signal, for example, so that each of the flip-flops generates an output signal that is an incrementally delayed version of the input signal. The delayed versions of the input signal may be logically combined to generate an output signal having a frequency equal to 1/N times the frequency of the input signal.

Other frequency dividers may form or operate as an oscillating circuit that generates output signals having a frequency equal to 1/N times the frequency of an input signal. For example, an injection-locked frequency divider may operate as a tuned oscillator that is locked to an input clock frequency divided by N. Injection-locked frequency dividers may be more efficient than flip-flop based frequency dividers at higher frequencies.

When a frequency divided output signal is used for timing one or more components of a circuit or device, it may be desirable to maintain the duty cycle of the frequency divided output signal at a desired and/or constant value.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to frequency dividers and methods of their operation. The frequency dividers disclosed herein may be used to generate an output signal having a frequency equal to 1/N times the frequency of an input signal, where N is an integer greater than one. In at least some embodiments, the frequency divider may be operated as a divide-by-3 frequency divider using a number M of delay stages coupled in series with each other, where M may be an integer equal to 3 or an integer multiple of 3. Also, in at least some embodiments, each of the delay stages may be or may include a differential amplifier having inputs coupled to the outputs of a previous delay stage and having outputs coupled to the inputs of a subsequent delay stage.

An example frequency divider disclosed herein may include at least an oscillator, a first coupling circuit, and a first multiplexer. The oscillator may include a plurality of delay elements coupled in series with each other. The first coupling circuit may be coupled to a first oscillator node, and may include a control terminal to receive a first retiming signal. The first multiplexer may include inputs coupled to receive the input signal and a complementary input signal, a control terminal coupled to a second oscillator node, and an output to provide the first retiming signal. In some embodiments, the first multiplexer may be configured to alternate between injecting the input signal into the first oscillator node based on rising edges of the input signal and injecting the input signal into the first oscillator node based on falling edges of the input signal in response to a logic state of an oscillation waveform appearing at the second oscillator node. In some aspects, the first oscillator node may receive a first oscillation waveform provided by a first delay element, the second oscillator node may receive a second oscillation waveform provided by a second delay element, and the first coupling circuit may be configured to re-time the first oscillation waveform based on a logical combination of the second oscillation waveform, the input signal, and the complementary input signal.

The frequency divider may also include a second coupling circuit and a second multiplexer. The second coupling circuit may be coupled to the second oscillator node, and may include a control terminal to receive a second retiming signal. The second multiplexer may include inputs to receive the input signal and the complementary input signal, a control terminal coupled to a third oscillator node, and an output to provide the second retiming signal. In some embodiments, the second multiplexer may be configured to alternate between injecting the input signal into the second oscillator node based on rising edges of the input signal and injecting the input signal into the second oscillator node based on falling edges of the input signal in response to a logic state of an oscillation waveform appearing at the third oscillator node. In addition, frequency divider may include a third coupling circuit and a third multiplexer. The third coupling circuit may be coupled to the third oscillator node, and may include a control terminal to receive a third retiming signal. The third multiplexer may include inputs to receive the input signal and the complementary input signal, a control terminal coupled to the first oscillator node, and an output to provide the third retiming signal. In some embodiments, the third multiplexer may be configured to alternate between injecting the input signal into the third oscillator node based on rising edges of the input signal and injecting the input signal into the third oscillator node based on falling edges of the input signal in response to a logic state of the oscillation waveform appearing at the first oscillator node.

Another example frequency divider disclosed herein may include at least a ring oscillator including a plurality of delay stages, a first coupling circuit configured to inject the input signal into a first delay stage of the plurality of delay stages based on a first retiming signal, and first logic configured to generate the first retiming signal based on a logical combination of the input signal and an oscillation waveform appearing at a second delay stage of the plurality of delay stages. In some embodiments, each of the plurality of delay stages may include a differential amplifier including an inverted input coupled to a non-inverted output of a previous delay stage, a non-inverted input coupled to an inverted output of the previous delay stage, an inverted output coupled to a non-inverted input of a next delay stage, and a non-inverted output coupled to an inverted input of the next delay stage. In some embodiments, the first logic may be a multiplexer including a first input to receive the input signal, a second input to receive a complementary input signal, a control terminal coupled to the second delay stage, and an output to provide the first retiming signal to the first coupling circuit.

In some embodiments, the first logic may also be configured to sequentially alternate between triggering the injection of the input signal into the first delay stage based on rising edges of the input signal and triggering the injection of the input signal into the first delay stage based on falling edges of the input signal. In addition, or in the alternative, the first logic may be configured to provide the input signal as the injection to the first delay stage when the oscillation waveform appearing at the second delay stage is in a first logic state, and to provide the complementary input signal as the injection to the first delay stage when the oscillation waveform appearing at the second delay stage is in a second logic state.

The frequency divider may also include a second coupling circuit configured to inject the input signal into the second delay stage based on a second retiming signal, and second logic configured to generate the second retiming signal based on a logical combination of the input signal and an oscillation waveform appearing at a third delay stage of the plurality of delay stages. In some embodiments, the second logic may be a multiplexer including a first input to receive the input signal, a second input to receive the complementary input signal, a control terminal coupled to the third delay stage, and an output to provide the second retiming signal to the second coupling circuit.

An example method disclosed herein may be used to operate a frequency divider. The method may include generating, in an oscillator including a plurality of delay stages, an oscillation waveform having a frequency equal to a frequency of the frequency-divided output signal, generating a first retiming signal based on a logical combination of the input signal and the oscillation waveform appearing at a selected delay stage of the oscillator, and injecting the input signal into a previous delay stage of the oscillator based on the first retiming signal. In some implementations, the first retiming signal may be configured to alternate between triggering the injection into the previous delay stage based on rising edges of the input signal and triggering the injection into the previous delay stage based on falling edges of the input signal in response to a logic state of the oscillation waveform appearing at the selected delay stage. In addition, or in the alternative, the injecting may include providing the input signal for injection into the previous delay stage in response to a first logic state of the oscillation waveform appearing at the selected delay stage, and providing a complementary input signal for injection into the previous delay stage in response to a second logic state of the oscillation waveform appearing at the selected delay stage.

The method may also include generating a second retiming signal based on a logical combination of the input signal and the oscillation waveform appearing at a subsequent delay stage of the oscillator, and injecting the input signal into the selected delay stage of the oscillator based on the second retiming signal. In some implementations, the second retiming signal may be configured to alternate between triggering the injection based on rising edges of the input signal and triggering the injection based on falling edges of the input signal in response to a logic state of the oscillation waveform appearing at the subsequent delay stage.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Figure 1A:
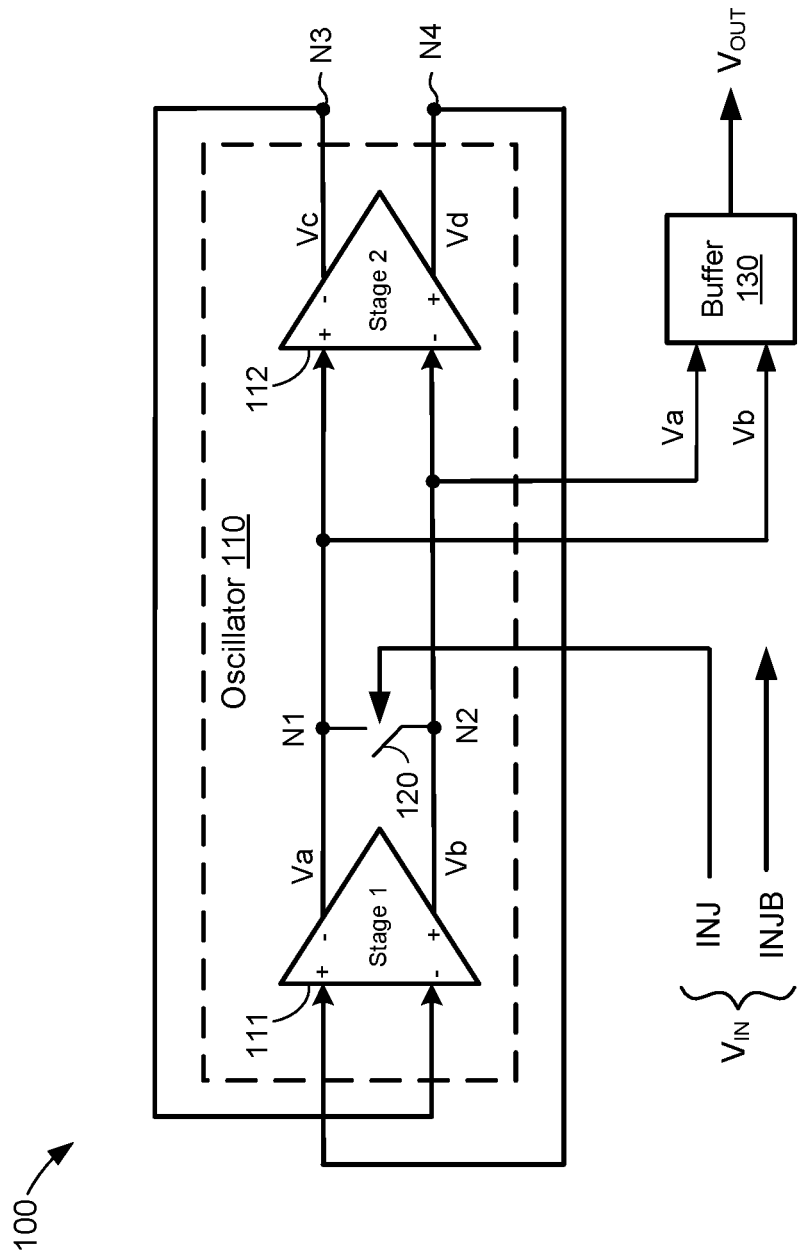
FIG. 1A is a block diagram of an example frequency divider.

Aspects of the present disclosure may improve the performance of an injection-locked frequency divider. An injection-locked frequency divider typically includes an oscillator that is tuned to the desired output frequency. For example, if the input signal to be frequency-divided has a frequency $f_{IN}$ and the desired output frequency is $f_{OUT}=f_{IN}/N$ (where N is an integer greater than 1), then the oscillator may be tuned to the output frequency $f_{OUT}$. The input signal may be coupled to (or "injected") the oscillator in a manner that re-times the oscillator to eliminate (or least reduce) drift and/or jitter of one or more oscillation waveforms from which the frequency-divided output signal may be provided. The sensitivity or responsiveness of the oscillation waveforms (and thus also the output signal) to injection of the input signal may be periodic in nature, and thus timing aspects related to the injection of the input signal into the oscillator may be important. For example, if the input signal is injected when the sensitivity of the oscillation waveforms signal is at a minimum value, then injection of the input signal may have a minimal effect upon the oscillator output signal. Conversely, if the input signal is injected when the sensitivity of the oscillation waveforms is at a maximum value, then injection of the input signal may have a detectable effect on the oscillator output signal (such as to re-time the oscillation waveforms).

When the value of the oscillator's frequency divide-by-number (N) is an even number, the oscillator output signal may exhibit a maximum sensitivity to injection of the input signal every Nth period of the input signal, and both the rising edges and the falling edges of the oscillator output signal may be re-timed by the same edge or logic transition of the injected input signal. As a result, every Nth period of the input signal may be associated with a retiming event during which the rising edge (or alternatively the falling edge) of the input signal may be used to re-time the oscillator. For example, if the value of N=2, then there may be a retiming event every other period of the input signal.

However, when the value of N is an odd number, logic state transitions of the oscillator output signal may not always be aligned with the corresponding logic state transitions of the injected input signal. As a result, both the rising and falling edges of the injected input signal may be used to re-time the oscillator. For example, if the value of N=3, then there may be a retiming event every $3^{rd}$ period of the input signal, which may require retiming the oscillator after 1.5 periods of the input signal. Asymmetries between the rising and falling edges of the injected input signal may cause duty cycle errors, deterministic jitter, and other undesirable effects.

Some frequency dividers may align injection of the input signal with logic state transitions of the oscillator nodes to reduce duty cycle errors and jitter. For example, the rising edges of the injected input signal may be aligned with rising edges of the waveform at the oscillator nodes, and the falling edges of the injected input signal may be aligned with falling edges of the waveform at the oscillator nodes. Although this solution may ensure that that the injection for alternating logic state transitions of the oscillator nodes is dominated by alternating injection devices, the amount of injection applied during logic low-to-high transitions may be different than the amount of injection applied during logic high-to-low transitions. The resulting imbalance in injection amounts for different logic state transitions of the oscillation waveform may cause timing errors. Moreover, this solution is typically frequently limited in injection strength, which in turn undesirably limits the lock range of the injection-locked frequency divider.

Aspects of the present disclosure may improve the performance of an injection-locked frequency divider by modifying or changing one or more aspects of the injection of the input signal into the oscillator based, at least in part, on the logic states of one or more nodes within the oscillator. In some implementations, logic (such as a multiplexer) may select either the input signal or its logical complement for injection into a first stage of the oscillator based on a logic state of the oscillation waveform appearing at another stage of the oscillator. In some aspects, logic state transitions of the oscillation waveform appearing at the other stage of the oscillator may periodically alternate (such as by reversing) the phase and/or polarity of the injection provided to the first stage of the oscillator in a manner that allows the oscillator to be retimed at least once during every period of the input signal. The techniques disclosed herein may also be applicable for injecting the input signal into multiple stages of an oscillator associated with one or more of the frequency dividers disclosed herein.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

FIG. 1A is a block diagram of an example injection-locked frequency divider 100. The frequency divider 100 is shown to include an oscillator 110, a switch 120, and a buffer circuit 130. The oscillator 110, which is shown as a 2-stage ring oscillator formed by a first differential amplifier 111 and a second differential amplifier 112 coupled in series with each other, may be configured to oscillate at a desired frequency. The stages of the oscillator 110 are depicted as including differential amplifiers 111-112 for illustrative purposes only. In other embodiments, any suitable delay elements (such as buffers, inverters, or delay circuits) may be used to form the oscillator 110. Further, although the oscillator 110 is described herein with respect to differential signaling, aspects of the present disclosure are equally applicable to oscillators and/or frequency dividers that employ single-ended signaling.

The first differential amplifier 111 includes a non-inverted input coupled to a non-inverted output of the second differential amplifier 112, and includes an inverted input coupled to an inverted output of the second differential amplifier 112. The second differential amplifier 112 includes a non-inverted input coupled to an inverted output of the first differential amplifier 111, and includes an inverted input coupled to a non-inverted output of the first differential amplifier 111. The first differential amplifier 111 may generate a first pair of output signals Va and Vb at respective oscillator nodes N1-N2, and the second differential amplifier 112 may generate a second pair of output signals Vc-Vd at respective nodes N3-N4.

In some implementations, the frequency divider 100 may be configured to operate as a divide-by-2 frequency divider that generates an output signal having a frequency ($f_{OUT}$) equal to one-half the frequency ($f_{IN}$) of an input signal (such that $f_{OUT}=f_{IN}/2$). The oscillator 110 may be tuned to the desired output frequency $f_{OUT}$, for example, such that the oscillation waveform represented by oscillation signals Va-Vb generated by the first differential amplifier 111 may have a frequency equal (or at least substantially equal) to $f_{OUT}$, and the oscillation waveform represented by oscillation signals Vc-Vd generated by the second differential amplifier 112 may have a frequency equal (or at least substantially equal) to $f_{OUT}$.

For the example of FIG. 1A, the injection signal INJ and its logical complement INJB may represent an input signal $V_{IN}$ provided to the frequency divider 100, and the oscillation signals Va-Vb generated by the first differential amplifier 111 may be used to generate a frequency-divided output signal $V_{OUT}$. Thus, in some aspects, the input signal $V_{IN}$ may have a frequency denoted by $f_{IN}$, and the output signal $V_{OUT}$ may have a frequency denoted by $f_{OUT}=f_{IN}/2$. In addition, or in the alternative, the oscillation signals Vc-Vd generated by the second differential amplifier 112 may provide the frequency-divided output signal $V_{OUT}$.

The switch 120 is coupled between oscillator nodes N1 and N2, and includes a control terminal to receive the injected input signal, which may also be referred to herein as the injection signal INJ. The switch 120 may selectively couple the oscillator nodes N1-N2 together based on the logic state of the injection signal INJ, for example, to periodically re-time the oscillator so that the output signal $V_{OUT}$ is maintained at the desired frequency-divided value $f_{OUT}$ and the duty cycle of the output signal $V_{OUT}$ is maintained at a desired level (such as, for example, 50%). More specifically, when the injection signal INJ is in a logic high state, the switch 120 is closed and electrically connects the oscillator nodes N1-N2 nodes together. A current provided by the closed switch 120 may increase the speed with which the respective voltages of signals Va-Vb converge to the same level, and may be used to adjust the timing of the oscillator 110. Conversely, when the injection signal INJ is in a logic low state, the switch 120 is opened and isolates the oscillator nodes N1-N2 from each other, thereby allowing the respective voltages of the signals Va-Vb to diverge from each other.

In some implementations, if the low-to-high transition of INJ occurs sufficiently close to (such as within a time period of) logic state transitions of signals Va-Vb, the injection signal INJ may influence or alter the timing of logic state transitions of the oscillation waveform appearing at the first stage of the oscillator 110 (such as the oscillation waveform represented by oscillation signals Va-Vb). In this manner, the injection signal INJ may be used to re-time the oscillator 110, for example, to maintain the output signal $V_{OUT}$ at the desired frequency $f_{OUT}$.

In some aspects, the on-resistance of the switch 120 may be relatively high compared to the output impedances of the first and second differential amplifiers 111-112, for example, so that the injection signal INJ may influence or affect the timing of the oscillator 110 only when the voltages of signals Va-Vb at respective oscillator nodes N1-N2 are the same or are converging to the same level (such as at the cross-over point for logic state transitions of signals Va-Vb). In this manner, the injection signal INJ may have little (if any) effect on the oscillator nodes N1-N2 at other times (such as when the signals Va-Vb are not transitioning between logic states).

The buffer circuit 130 includes inputs to receive the oscillation signals Va-Vb at respective oscillator nodes N1-N2, and includes an output to provide the output signal $V_{OUT}$. Although the output signal $V_{OUT}$ is shown as a single-ended signal for the example of FIG. 1A, in other implementations, the output signal $V_{OUT}$ may be a differential signal. In addition, or in the alternative, the oscillation signals Vc-Vd may be used to provide or generate a second output signal. This second output signal may have the same frequency and duty cycle as the output signal $V_{OUT}$ generated by signals Va-Vb, and may be offset from the output signal $V_{OUT}$ by 180 degrees. In this manner, the frequency divider 100 may provide a multi-phased output signal having a frequency equal to one-half the frequency of the input signal $V_{IN}$.

Figure 1B:
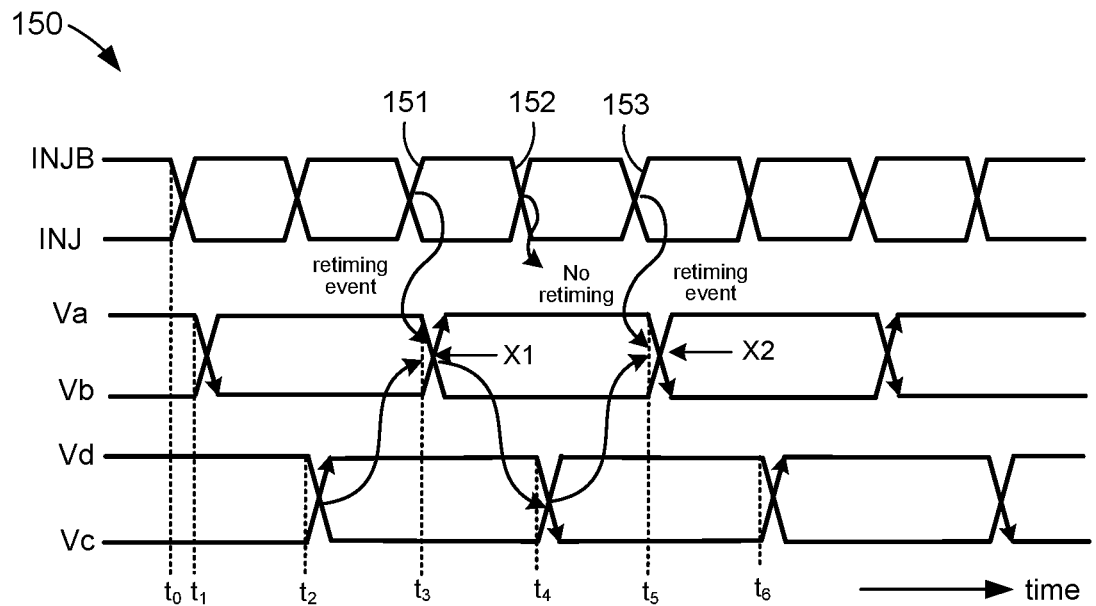
FIG. 1B is an example timing diagram for signals generated by the frequency divider of FIG. 1A when configured to operate as a divide-by-2 frequency divider.

FIG. 1B shows an example timing diagram 150 for signals generated by the frequency divider 100 when configured to operate as a divide-by-2 frequency divider. Prior to time $t_0$, the injection signal INJ is logic low, signal Va is logic high and signal Vb is logic low, and signal Vc is logic low and signal Vd is logic high. At time $t_1$, signals Va-Vb begin to transition logic states, with signal Va transitioning from logic high to logic low and signal Vb transitioning from logic low to logic high. In response thereto, the second differential amplifier 112 causes signal Vc to begin transitioning from logic low to logic high and causes signal Vd to begin transitioning from logic high to logic low at time $t_2$. The logic state transitions of signals Vc-Vd cause the first differential amplifier 111 to begin transitioning signal Va from logic low to logic high and transitioning signal Vb from logic high to logic low at time $t_3$. In some aspects, the time period between times $t_1$ and $t_2$ may correspond to a propagation delay of the second differential amplifier 112, and the time period between times $t_2$ and $t_3$ may correspond to a propagation delay of the first differential amplifier 111.

Just before time $t_3$, a rising edge 151 (e.g., logic low-to-high transition) of the injection signal INJ causes the switch 120 to close and short the oscillator nodes N1-N2 together prior to or currently with the logic state transitions of signals Va-Vb at time $t_3$. When the oscillator nodes N1-N2 are coupled together via the switch 120 sufficiently close in time with logic state transitions of signals Va-Vb (such as within a time period prior to such logic state transitions), current through the switch 120 may increase the speed with which the respective voltages of signals Va-Vb converge to the same level (such as the cross-over point X1 depicted in FIG. 1B). In this manner, the rising edge 151 of the injection signal INJ may qualify as a retiming event in which the injection signal INJ is able to alter or re-time the oscillator 110. In some aspects, the injection signal INJ may be used to pause or restart an oscillator waveform associated with the oscillator 110.

The falling edge 152 (e.g., logic high-to-low transition) of the injection signal INJ just before time $t_4$ causes the switch 120 to open and isolate the oscillator nodes N1-N2 from each other. The resulting logic low state of the injection signal INJ may ensure that the switch 120 allows the respective voltages of signals Va-Vb to diverge from each other (such as to opposite logic states). In response to the logic state transitions of signals Va-Vb, the second differential amplifier 112 causes signal Vc to begin transitioning from logic high to logic low and causes signal Vd to begin transitioning from logic low to logic high at time $t_4$. Then, at time $t_5$, signal Va begins transitioning from logic high to logic low, and signal Vb begins transitioning from logic low to logic high.

The rising edge 153 (e.g., logic low-to-high transition) of the injection signal INJ just before time $t_5$ causes the switch 120 to close, thereby coupling the oscillator nodes N1-N2 together as the signals Va-Vb begin transitioning logic states at time $t_5$. As described above, the closed switch 120 may provide a current that increases the speed with which the voltages of signals Va-Vb converge to the same level (such as the cross-over point X2 depicted in FIG. 1B). In this manner, the injection signal INJ may be used to alter the timing of the oscillator 110. In some aspects, the injection signal INJ may be used to pause or restart an oscillator waveform associated with the oscillator 110.

In other implementations, the frequency divider 100 may be configured to operate as a divide-by-3 frequency divider that generates an output signal having a frequency ($f_{OUT}$) equal to one-third the frequency ($f_{IN}$) of an input signal (such that $f_{OUT}=f_{IN}/3$). The oscillator 110 may be tuned to the desired output frequency $f_{OUT}$, for example, such that the output signals Va-Vb generated by the first differential amplifier 111 may have a frequency equal (or at least substantially equal) to $f_{OUT}$ and the output signals Vc-Vd generated by the second differential amplifier 112 may have a frequency equal (or at least substantially equal) to $f_{OUT}$.

Figure 1C:
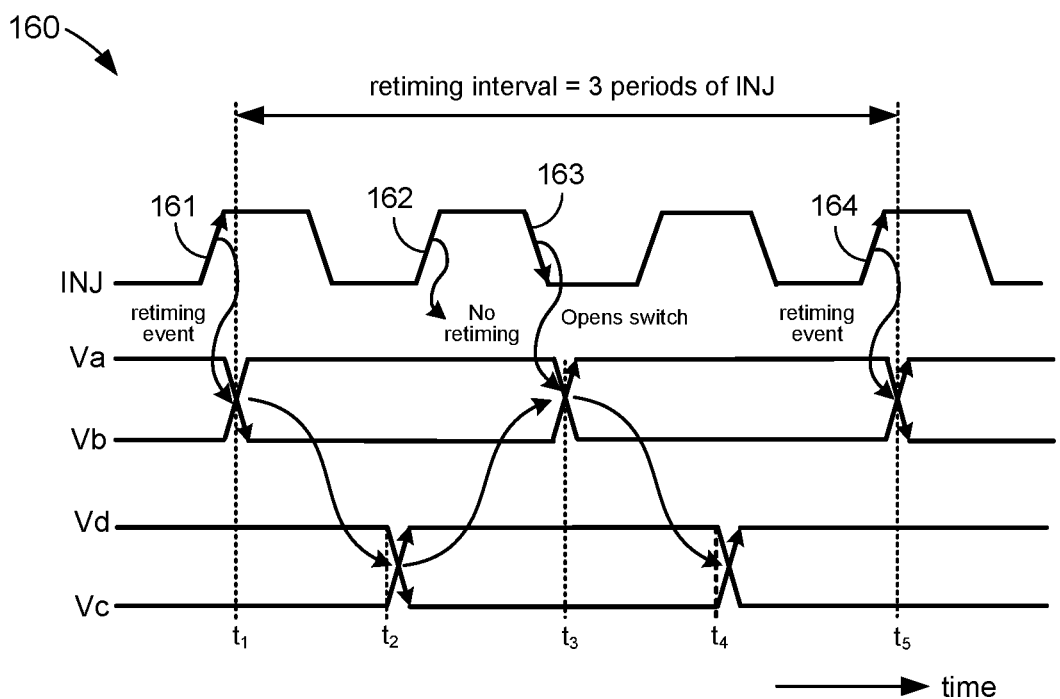
FIG. 1C is an example timing diagram for signals generated by the frequency divider of FIG. 1A when configured to operate as a divide-by-3 frequency divider.

FIG. 1C shows an example timing diagram 160 for signals generated by the frequency divider 100 when configured to operate as a divide-by-3 frequency divider. Prior to time $t_0$, the injection signal INJ is logic low, signal Va is logic high and signal Vb is logic low, and signal Vc is logic low and signal Vd is logic high. At time $t_1$, signal Va begins to transition from logic high to logic low, and signal Vb begins to transition from logic low to logic high. In response thereto, signal Vc begins to transition from logic low to logic high and signal Vd begins to transition from logic high to logic low, after a delay associated with the second differential amplifier 112, at time $t_2$. The logic state transitions of signals Vc-Vd cause signal Va to begin transitioning from logic low to logic high and cause signal Vb to begin transitioning from logic high to logic low, after a delay associated with the first differential amplifier 111, at time $t_3$. In some aspects, the time period between times $t_1$ and $t_2$ may correspond to the propagation delay of the second differential amplifier 112, and the time period between times $t_2$ and $t_3$ may correspond to the propagation delay of the first differential amplifier 111.

A first rising edge 161 (e.g., logic low-to-high transition) of the injection signal INJ may occur sufficiently close in time with the logic state transition of signals Va-Vb at time $t_1$ to qualify as a retiming event in which the injection signal INJ closes the switch 120 and re-times the oscillator 110. The next rising edge 162 of the injection signal INJ does not occur sufficiently close in time with any logic state transitions of signals Va-Vb to qualify as a retiming event, and thus the resulting closed state of the switch 120 has very little (if any) effect on the logic states of signals Va-Vb between times $t_1$ and $t_3$. Although the falling edge 163 of the injection signal INJ occurs sufficiently close in time $t_0$ the logic state transitions of signals Va-Vb at time $t_3$ to qualify as a retiming event, the falling edge 163 of the injection signal INJ opens the switch 120 (rather than closes the switch 120) just before the logic state transitions of signals Va-Vb at time $t_3$, and therefore may not affect the timing of the logic state transitions of signals Va-Vb in the manner described above with respect to the retiming event at time $t_1$. More specifically, although the amount of injection provided to the oscillator nodes N1-N2 by the switch 120 prior to being opened may not be sufficient to re-time the oscillator 110 at time $t_3$, the injection may undesirably introduce timing errors into the oscillation waveform appearing at the oscillator nodes N1-N2.

In response to the logic state transitions of signals Va-Vb at time $t_3$, the second differential amplifier 112 causes signal Vc to begin transitioning from logic high to logic low and causes signal Vd begin transitioning from logic low to logic high (after a delay associated with the second differential amplifier 112) at time $t_4$. Thereafter, the first differential amplifier 111 causes signal Va to begin transitioning from logic high to logic low and causes signal Vb begin transitioning from logic low to logic high (after a delay associated with the first differential amplifier 111) at time $t_5$. In some aspects, the time period between times $t_3$ and $t_4$ may correspond to the propagation delay of the second differential amplifier 112, and the time period between times $t_4$ and $t_5$ may correspond to the propagation delay of the first differential amplifier 111. The rising edge 164 (e.g., logic low-to-high transition) of the injection signal INJ may occur sufficiently close in time $t_0$ the logic state transitions of signals Va-Vb at time $t_5$ to qualify as a retiming event in which the injection signal INJ closes the switch 120 and re-times the oscillator 110.

The effect of the injection signal INJ on the oscillator 110 at time $t_3$ is different than the effect of the injection signal INJ on the oscillator 110 at time $t_1$, for example, because the rising edge 161 of the injection signal INJ at time $t_1$ closes the switch 120 while the falling edge 163 of the injection signal INJ at time $t_3$ opens the switch 120. As a result, the interval between the retiming events at times $t_1$ and $t_5$ is equal to 3 periods of the injection signal INJ, as depicted in FIG. 1C. Thus, when configured to operate as a divide-by-3 frequency divider, the injection-locked frequency divider 100 may be able to re-time the oscillator nodes N1-N2 at every other logic state transition of signals Va-Vb (rather than at every logic state transition of signals Va-Vb). Accordingly, the divide-by-3 configuration of the injection-locked frequency divider 100 may experience more drift and jitter than the divide-by-2 configuration of the injection-locked frequency divider 100. In addition, limiting retiming events to every third edge of the injection signal INJ may undesirably limit the lock range of the oscillator 110. More specifically, because the lock range of the oscillator 110 may be based on the effectiveness of the injection signal INJ, the ability to align a retiming event with each of the logic state transitions of signals Va-Vb may increase the lock range (such as compared with configurations in which the retiming event occurs every third logic state transition of the signals Va-Vb).

Figure 2A:
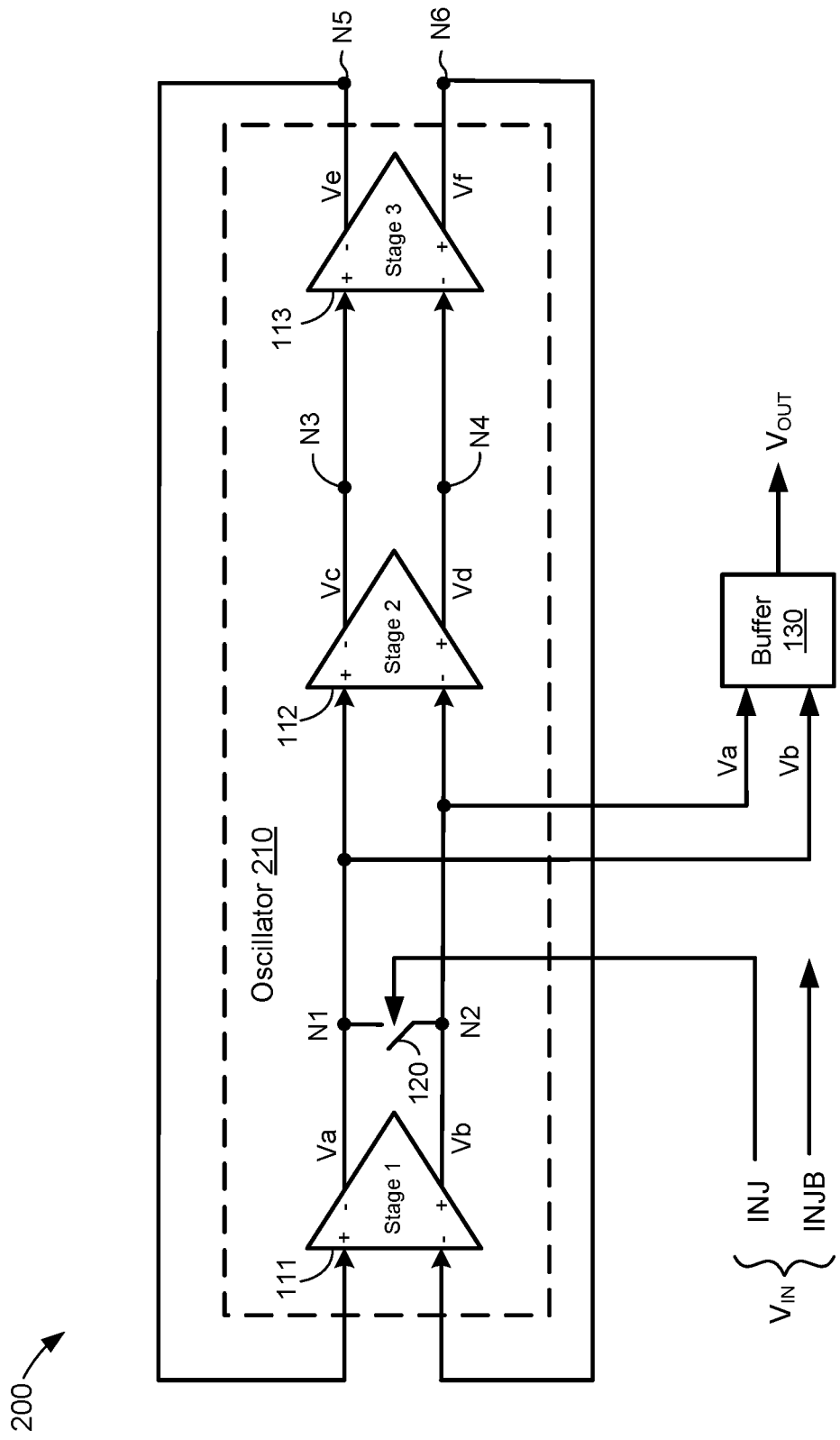
FIG. 2A is a block diagram of another example frequency divider.

FIG. 2A is a block diagram of another example injection-locked frequency divider 200. The frequency divider 200 is shown to include an oscillator 210, the switch 120, and the buffer circuit 130. The oscillator 210, which is shown as a 3-stage ring oscillator formed by the first differential amplifier 111, the second differential amplifier 112, and a third differential amplifier 113, may be configured to oscillate at a desired frequency. The stages of the oscillator 210 are depicted as including differential amplifiers 111-113 for illustrative purposes only. In other implementations, any suitable delay elements (such as buffers, inverters, or delay circuits) may be used to form the oscillator 210. Further, although the oscillator 210 is described herein with respect to differential signaling, aspects of the present disclosure are equally applicable to oscillators and/or frequency dividers that employ single-ended signaling.

The first differential amplifier 111 includes a non-inverted input coupled to an inverted output of the third differential amplifier 113 (at node N5), and includes an inverted input coupled to a non-inverted output of the third differential amplifier 113 (at node N4). The second differential amplifier 112 includes a non-inverted input coupled to an inverted output of the first differential amplifier 111, and includes an inverted input coupled to a non-inverted output of the first differential amplifier 111. The third differential amplifier 113 includes a non-inverted input coupled to an inverted output of the second differential amplifier 112, and includes an inverted input coupled to a non-inverted output of the second differential amplifier 112. For the example of FIG. 2A, the first differential amplifier 111 generates oscillation signals Va-Vb at respective oscillator nodes N1-N2, the second differential amplifier 112 generates oscillation signals Vc-Vd at respective oscillator nodes N3-N4, and the third differential amplifier 113 generates oscillation signals Ve-Vf at respective oscillator nodes N5-N6. In some aspects, the oscillation signals Va-Vb may be a differential representation of a first oscillation waveform appearing at the first stage of the oscillator 210, the oscillation signals Vc-Vd may be a differential representation of a second oscillation waveform appearing at the second stage of the oscillator 210, and the oscillation signals Ve-Vf may be a differential representation of a third oscillation waveform appearing at the third stage of the oscillator 210.

In some implementations, the frequency divider 200 may be configured to operate as a divide-by-3 frequency divider that generates an output signal having a frequency ($f_{OUT}$) equal to one-third the frequency ($f_{IN}$) of an input signal (such that $f_{OUT}=f_{IN}/3$). The oscillator 210 may be tuned to the desired output frequency $f_{OUT}$, for example, such that the first oscillation waveform represented by signals Va-Vb may have a frequency equal (or at least substantially equal) to $f_{OUT}$, the second oscillation waveform represented by signals Vc-Vd may have a frequency equal (or at least substantially equal) to $f_{OUT}$, and the output signals Ve-Vf generated by the third differential amplifier 113 may have a frequency equal (or at least substantially equal) to $f_{OUT}$.

The switch 120 coupled between oscillator nodes N1 and N2 may be selectively opened and closed based on the injection signal INJ, for example, to periodically re-time the oscillator 210 so that the output signal $V_{OUT}$ is maintained at the desired frequency-divided value $f_{OUT}$. For example, when the injection signal INJ is in a logic high state, the switch 120 is closed and electrically connects the oscillator nodes N1-N2 nodes together, which may increase the speed with which the signals Va-Vb converge to the same voltage level. Conversely, when the injection signal INJ is in a logic low state, the switch 120 is opened and isolates the oscillator nodes N1-N2 nodes from each other, thereby allowing the voltage levels of the signals Va-Vb to diverge from each other. More specifically, if the low-to-high transition of INJ occurs sufficiently close to (such as within a time period of) logic state transitions of signals Va-Vb, the injection signal INJ may alter the timing of logic state transitions of the first oscillation waveform appearing at the first stage of the oscillator 210. In this manner, the injection signal INJ may be used to re-time the oscillator 210, for example, to maintain the output signal $V_{OUT}$ at the desired frequency $f_{OUT}$. It is noted that because the frequency divider 200 does not have a phase reference, the oscillator 210 may be restarted at any time (or point within the oscillation waveform).

The buffer circuit 130 includes inputs coupled to oscillator nodes N1-N2, and includes an output to provide the output signal $V_{OUT}$. Thus, for the example of FIG. 2A, the signals Va and Vb generated by the first differential amplifier 111 may form the output signal $V_{OUT}$. Although shown as a single-ended output signal, the output signal $V_{OUT}$ may be a differential signal. In addition, or in the alternative, the oscillation signals Vc and Vd may be used to provide a second output signal having the same frequency and duty cycle as the output signal provided by signals Va and Vb, except offset by one-half the period of the input oscillation waveform. In addition, or in the alternative, the oscillation signals Ve and Vf may be used to provide a third output signal having the same frequency and duty cycle as the output signal provided by signals Va and Vb, except offset by one-half the period of the input oscillation waveform. In this manner, the frequency divider 200 may provide a multi-phased output signal.

Figure 2B:
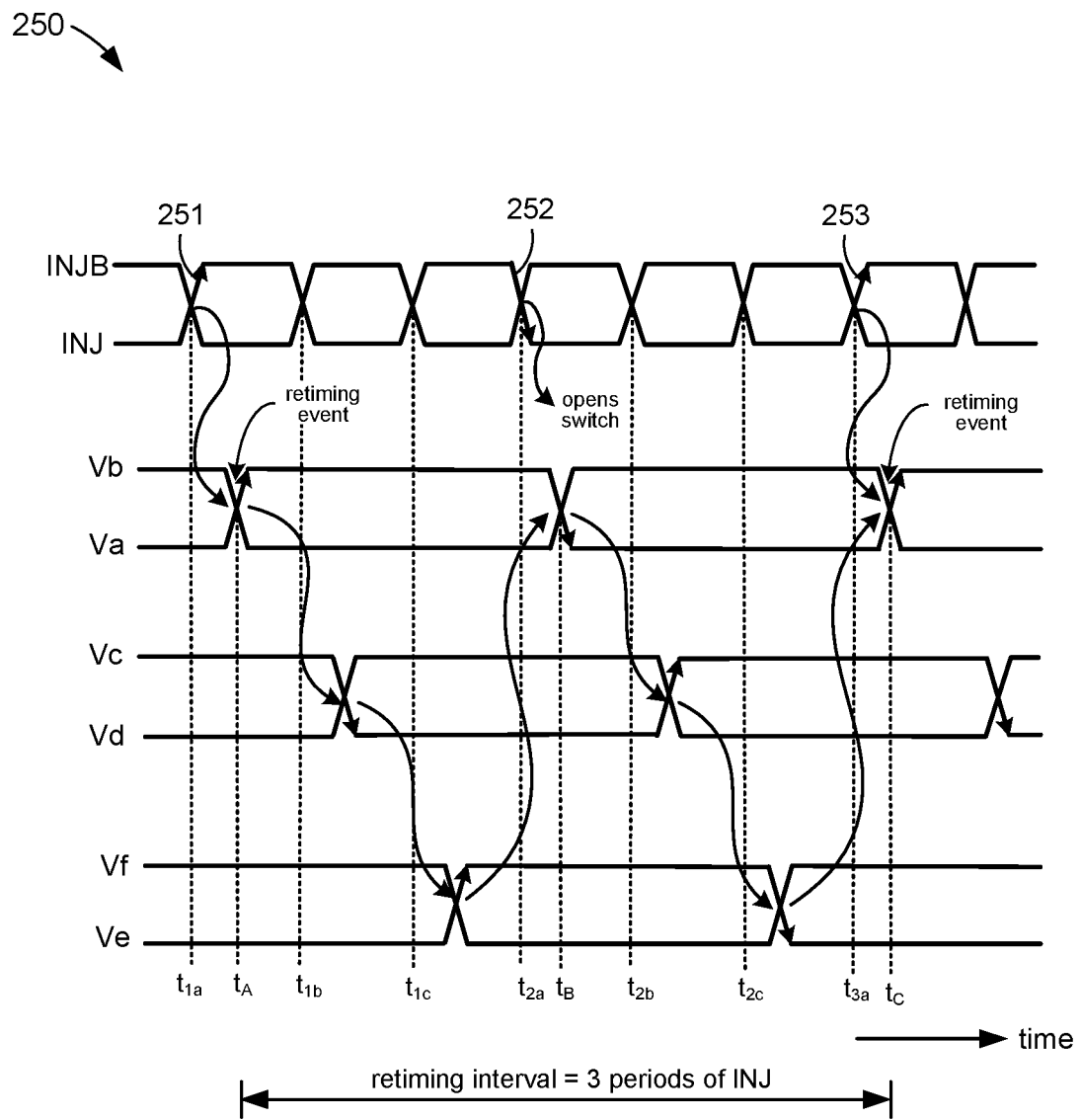
FIG. 2B is an example timing diagram for signals generated by the frequency divider of FIG. 2A.

FIG. 2B shows an example timing diagram 250 for signals generated by the frequency divider 200 when configured to operate as a divide-by-3 frequency divider. Prior to time $t_{1a}$, the injection signal INJ is logic low, signal Va is logic low and signal Vb is logic high, signal Vc is logic high and signal Vd is logic low, and signal Ve is logic low and signal Vf is logic high. At time $t_{1a}$, signal Va begins transitioning from logic low to logic high, and signal Vb begins transitioning from logic high to logic low. For the example of FIG. 2B, the rising edge 251 (e.g., logic low-to-high transition) of the injection signal INJ at time $t_0$ occurs sufficiently close in time $t_0$ the logic state transitions of signals Va-Vb at time $t_{1a}$ to qualify as a retiming event. More specifically, the rising edge 251 of the injection signal INJ closes the switch 120 and electrically connects the oscillator nodes N1-N2 together, thereby providing current to more quickly converge the voltages of signals Va-Vb to the same level at time $t_A$.

In response to the logic state transitions of signals Va-Vb, the second differential amplifier 112 causes signal Vc to transition from logic high to logic low, and causes signal Vd to transition from logic low to logic high (after a delay associated with the second differential amplifier 112). The logic state transitions of signals Vc-Vd occurring just after time $t_{1b}$ cause signal Ve to transition from logic low to logic high and cause signal Vf to transition from logic high to logic low (after a delay associated with the third differential amplifier 113). The logic state transitions of signals Ve-Vf occurring just after time $t_{1c}$ cause signal Va to transition from logic high to logic low and cause signal Vb to transition from logic low to logic high (after the delay associated with the first differential amplifier 111).

Although the falling edge 252 (e.g., logic high-to-low transition) of the injection signal INJ at time $t_{2a}$ occurs sufficiently close in time $t_0$ the logic state transitions of signals Va-Vb at time $t_B$ to qualify as a retiming event, the falling edge 252 of the injection signal INJ at time $t_{2a}$ opens the switch 120 (rather than closes the switch 120) just before the logic state transitions of signals Va-Vb at time $t_B$, and therefore may not affect the timing of the logic state transitions of signals Va-Vb in the manner described above with respect to the retiming event at time $t_A$. More specifically, although the amount of injection provided to the oscillator nodes N1-N2 by the switch 120 prior to being opened may not be sufficient to re-time the oscillator 210 at time $t_B$, the injection may undesirably introduce timing errors into the oscillation waveform appearing at the oscillator nodes N1-N2.

In response to the logic state transitions of signals Va-Vb, the second differential amplifier 112 causes signal Vc to transition from logic low to logic high and causes signal Vd to transition from logic high to logic low (after the delay associated with the second differential amplifier 112). The logic state transitions of signals Vc-Vd cause signal Ve to transition from logic high to logic low and cause signal Vf to transition from logic low to logic high (after a delay associated with the third differential amplifier 113). In response thereto, the first differential amplifier 111 causes signal Va to begin transitioning from logic low to logic high and causes signal Vb to begin transitioning from logic high to logic low.

The rising edge 253 (e.g., logic low-to-high transition) of the injection signal INJ at time $t_{3a}$, which closes the switch 120 and electrically connects the oscillator nodes N1-N2 together, is sufficiently close in time $t_0$ the logic state transitions of signals Va-Vb to qualify as a retiming event. In this manner, the closed switch 120 may allow the voltages of signals Va-Vb to more quickly converge to the same level, thereby retiming the oscillator nodes N1-N2 at time $t_C$. However, because the falling edge 252 of the injection signal INJ at time $t_{2A}$ causes the switch 120 to open rather than to close, the oscillator nodes N1-N2 may be retimed in a same or consistent manner only once during every 3 periods of the injection signal INJ. As a result, the output signal $V_{OUT}$ generated by the frequency divider 200 may include unacceptable amounts of drift and/or jitter.

In other implementations, the frequency divider 200 may include a pair of CMOS inverters (not shown for simplicity) configured to pull the oscillator nodes N1-N2 to different voltage supplies in response to rising edges of the injection signal INJ. For example, a first CMOS inverter may be used to pull oscillator node N1 to VDD in response to rising edges of the injection signal INJ, and a second CMOS inverter may be used to pull oscillator node N2 to ground potential in response to rising edges of the injection signal INJ. In this manner, the oscillator nodes N1-N2 may be retimed during each period of the injection signal INJ. However, because CMOS inverters employ PMOS devices to pull nodes to VDD and employ NMOS devices to pull nodes to ground potential, the injection effects on the oscillator nodes N1-N2 resulting from rising edges of the injection signal INJ may be different than the injection effects on the oscillator nodes N1-N2 resulting from falling edges of the injection signal INJ. These differences in injection effects may undesirably lead to inadvertent changes in the duty cycle of the output signal $V_{OUT}$.

In accordance with some aspects of the present disclosure, the edge of the input signal INJ that triggers injection of a given oscillator node may be sequentially alternated in a manner that allows a consistent amount of injection to be provided to the oscillator during each logic state transition of the given node. In some implementations, the oscillator may sequentially alternate between using a rising edge of the input signal and a falling edge of the input signal to trigger injection to the given oscillator node. In this manner, the oscillator may be retimed by the injection during each period of an oscillation waveform, irrespective of whether a respective one of the logic state transitions aligns with the rising edge of the input signal or the falling edge of the input signal.

Figure 3A:
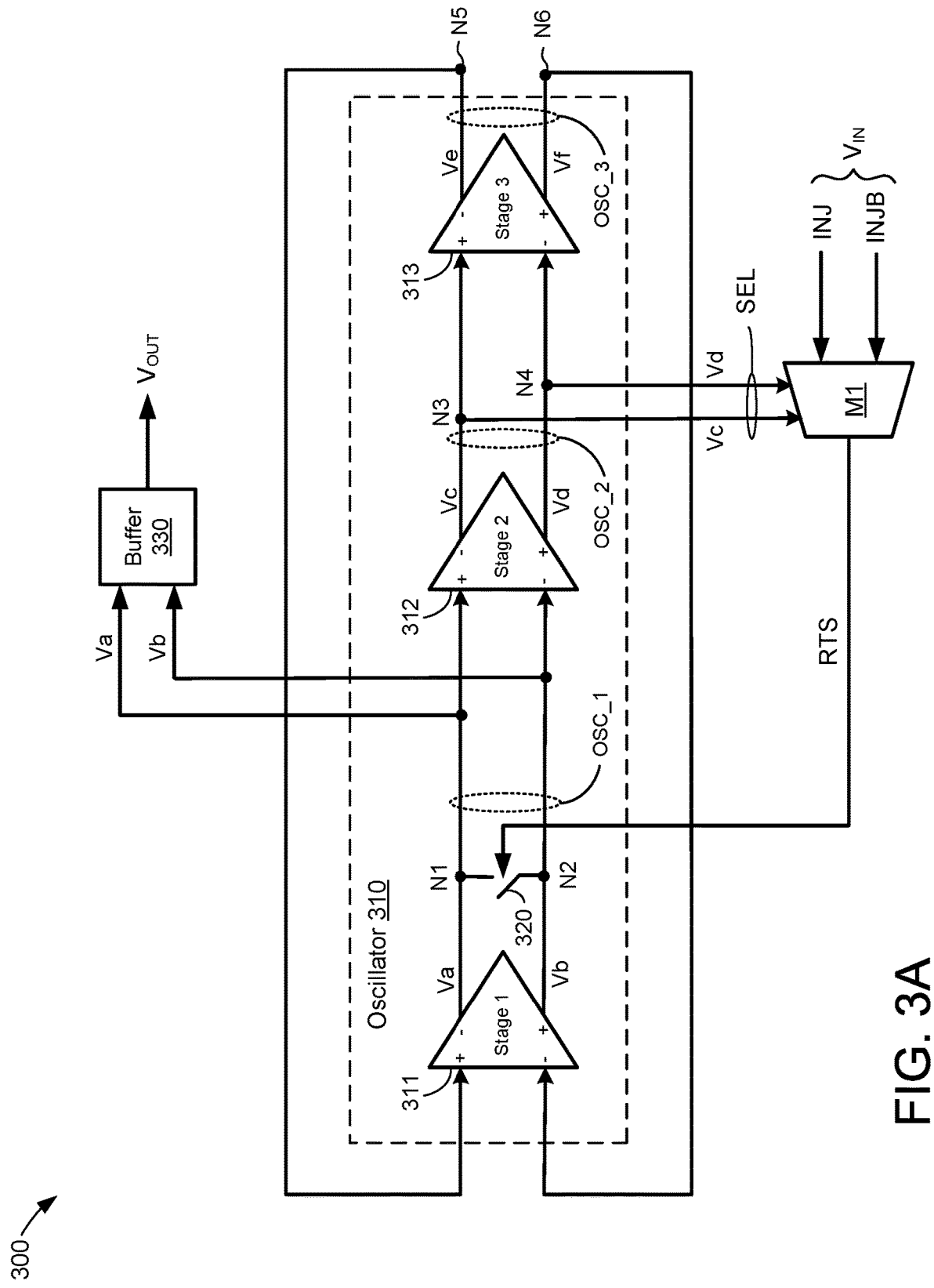
FIG. 3A is a block diagram of an example frequency divider, in accordance with some embodiments.

FIG. 3A is a block diagram of an example frequency divider 300 in accordance with some embodiments. The frequency divider 300, which may operate as an injection-locked frequency divider, is shown to include an oscillator 310, a switch 320, a buffer circuit 330, and a multiplexer (MUX) M1. The oscillator 310, which is shown as a 3-stage ring oscillator formed by a first differential amplifier 311, a second differential amplifier 312, and a third differential amplifier 313 coupled in series with each other, may be configured to oscillate and/or generate an oscillating waveform at a desired frequency. The stages of the oscillator 310 are depicted as including differential amplifiers 311-313 for illustrative purposes only. In other implementations, any suitable delay elements (such as buffers, inverters, or delay circuits) may be used to form the oscillator 310. Therefore, in some aspects, each of the differential amplifiers 311-313 of the oscillator 310 may also be referred to herein as a delay element or a delay stage. Further, although the oscillator 310 is described herein with respect to differential signaling, aspects of the present disclosure are equally applicable to oscillators and/or frequency dividers that employ single-ended signaling.

The first differential amplifier 311 includes a non-inverted input coupled to an inverted output of the third differential amplifier 313, and includes an inverted input coupled to a non-inverted output of the third differential amplifier 313. The second differential amplifier 312 includes a non-inverted input coupled to an inverted output of the first differential amplifier 311, and includes an inverted input coupled to a non-inverted output of the first differential amplifier 311. The third differential amplifier 313 includes a non-inverted input coupled to an inverted output of the second differential amplifier 312, and includes an inverted input coupled to a non-inverted output of the second differential amplifier 312.

The first differential amplifier 311 may generate a first oscillation waveform (OSC_1) represented by a first pair of oscillation signals Va-Vb at respective oscillator nodes N1-N2, and may correspond to a first stage of the oscillator 310. The second differential amplifier 312 may generate a second oscillation waveform (OSC_2) represented by a second pair of oscillation signals Vc-Vd at respective oscillator nodes N3-N4, and may correspond to a second stage of the oscillator 310. The third differential amplifier 313 may generate a third oscillation waveform (OSC_3) represented by a third pair of oscillation signals Ve-Vf at respective oscillator nodes N5-N6, and may correspond to a third stage of the oscillator 310. Thus, in some aspects, the oscillation signals Va-Vb may be a differential representation of the first oscillation waveform (OSC_1) appearing at the first stage of the oscillator 310, the oscillation signals Vc-Vd may be a differential representation of the second oscillation waveform (OSC_2) appearing at the second stage of the oscillator 310, and the oscillation signals Ve-Vf may be a differential representation of the third oscillation waveform (OSC_3) appearing at the third stage of the oscillator 310.

In some embodiments, the frequency divider 300 may be configured to operate as a divide-by-3 frequency divider that generates an output signal $V_{OUT}$ having a frequency equal to one-third the frequency of an input signal $V_{IN}$ (such as $f_{OUT}=f_{IN}/3$). The oscillator 310 may be tuned to the desired output frequency $f_{OUT}$, for example, such that the signals Va-Vb generated by the first differential amplifier 311 may have a frequency equal (or at least substantially equal) to $f_{OUT}$, the signals Vc-Vd generated by the second differential amplifier 312 may have a frequency equal (or at least substantially equal) to $f_{OUT}$, and the signals Ve-Vf generated by the third differential amplifier 313 may have a frequency equal (or at least substantially equal) to $f_{OUT}$. Further, although depicted in FIG. 3A as including 3 delay stages, the frequency divider 300 may, in other embodiments, operate as a divide-by-3 frequency divider using a number M of delay stages coupled in series with each other, where M may be an integer multiple of 3. In some other embodiments, the frequency divider 300 may be configured to operate as a divide-by-N frequency divider that generates an output signal $V_{OUT}$ having a frequency equal to 1/N times the frequency of the input signal $V_{IN}$ (such as $f_{OUT}=f_{IN}/N$).

The switch 320 is coupled between oscillator nodes N1 and N2, and includes a control terminal to receive a retiming signal (RTS). The switch 320 may be any suitable coupling circuit or device capable of selectively coupling the oscillator nodes N1-N2 together (or otherwise adjusting an impedance between the oscillator nodes N1-N2) based on a logic state of RTS. In some implementations, the coupling circuit (e.g., the switch 320) may be configured to adjust its drive strength, its series resistance, and/or other suitable operating characteristics based on one or more control signals (not shown for simplicity). For the example embodiments described herein, a logic high state and/or a rising edge of RTS may close the switch 320 at retiming events to alter timing aspects of the oscillator 310 (such as by retiming or restarting the first oscillation waveform (OSC_1) appearing at the first stage of the oscillator 310), and a logic low state and/or a falling edge of RTS may open the switch 320 in an absence of retiming events to isolate the oscillator nodes N1-N2 from each other. For other embodiments, the falling edge of RTS may close the switch 320 at retiming events, and the rising edge of RTS may open the switch 320 in an absence of retiming events. As described below, the retiming signal RTS may be used to periodically re-time the oscillator 310, for example, to maintain the output signal $V_{OUT}$ at the desired frequency-divided value $f_{OUT}$ and/or at a desired duty cycle (such as 50%).

In some aspects, the on-resistance of the switch 320 may be relatively high compared to the output impedances of the differential amplifiers 311-313, for example, so that the injection signal INJ may influence or affect the timing of the oscillator 310 only when the voltages of signals Va-Vb at respective oscillator nodes N1-N2 are the same or are converging to the same level (such as at the cross-over point for logic state transitions of signals Va-Vb). In this manner, the injection signal INJ may have little (if any) effect on the oscillator nodes N1-N2 at other times (such as when the signals Va-Vb are not transitioning between logic states).

The buffer circuit 330 includes inputs to receive the first oscillation waveform (OSC_1) appearing at the first stage of the oscillator 310 via oscillator nodes N1-N2, and includes an output to provide the output signal $V_{OUT}$. Although the output signal $V_{OUT}$ is shown as a single-ended signal for the example of FIG. 3A, in other implementations, the output signal $V_{OUT}$ may be a differential signal. In addition, or in the alternative, the second oscillation waveform (OSC_2) appearing at the second stage of the oscillator 310 may be used via oscillator nodes N3-N4 to provide or generate a second output signal. This second output signal may have the same frequency and duty cycle as the output signal $V_{OUT}$ generated by signals Va-Vb, and may be offset from the output signal $V_{OUT}$ by, for example, 120 degrees. In a similar manner, the third oscillation waveform (OSC_3) appearing at the third stage of the oscillator 310 may be used via oscillator nodes N5-N6 to provide or generate a third output signal. This third output signal may have the same frequency and duty cycle as the output signal $V_{OUT}$ generated by signals Va-Vb, and may be offset from the output signal $V_{OUT}$ by, for example, 240 degrees. In this manner, the frequency divider 300 may provide a multi-phased output signal having a frequency equal to one-third the frequency of the input signal $V_{IN}$.

The MUX M1 may include inputs to receive the input signal and the complementary input signal INJB, control terminals coupled to receive a select signal (SEL) formed by the second oscillation waveform (OSC_2) appearing at nodes N3-N4 of the oscillator 310, and an output to provide the retiming signal RTS to the switch 320. In some implementations, the MUX M1 may select either the injection signal INJ or the complementary injection signal INJB to provide as the retiming signal RTS to the switch 320 based on the logic state or logic state transitions of the second oscillation waveform (OSC_2). In response to the logic state of RTS, the switch 320 may selectively couple the oscillator nodes N1-N2 together and thereby alter the timing of the first oscillation waveform (OSC_1) appearing at the first stage of the oscillator 310. In other implementations, the select signal SEL may be formed or provided by an oscillation waveform appearing at another suitable stage of the oscillator 310. For example, in some aspects, the select signal SEL may be formed by the third oscillation waveform (OSC_3) appearing at the third stage of the oscillator 310 (at oscillator nodes N5-N6).

As mentioned above, the MUX M1 may be any suitable logic that selects one of the signals INJ and INJB based on the logic state of an oscillation waveform appearing at another stage of the oscillator 310. In some embodiments, the MUX M1 may include internal buffering, external buffering, and/or a number of programmable characteristics (such as drive strength) that may be used to avoid loading the oscillation nodes, to dynamically adjust signal propagation delays, and to dynamically adjust drive strengths.

The logic state of RTS, which may be based on a logical combination of the second oscillation waveform (OSC_2) represented by signals Vc-Vd and input signals INJ and INJB, may be used to re-time the oscillator 310 at the oscillator nodes N1-N2. For example, a logic high state of SEL may cause MUX M1 to provide the injection signal INJ as the retiming signal RTS to the switch 320, and a logic low state of SEL may cause MUX M1 to provide the complementary injection signal INJB as the retiming signal RTS to the switch 320. In some aspects, the MUX M1 may be configured to alternate between providing an injection into the first oscillator stage based on rising edges of the input signal and providing an injection into the first oscillator stage based on falling edges of the input signal in response to the logic state of the second oscillation waveform (OSC_2) appearing at the second oscillator stage. In this manner, the MUX M1 may sequentially alternate between triggering an injection into the first oscillator stage based on rising edges of the input signal and triggering an injection into the first oscillator stage based on falling edges of the input signal. As described below, the MUX M1 may provide a consistent amount of injection to the first oscillator stage at oscillator nodes N1-N2 at during every period of the oscillation waveform propagating through the oscillator 310, which in turn may allow the frequency divider 300 to maintain the oscillation waveform OSC_1 (and thus the output signal $V_{OUT}$) and at the desired frequency $f_{OUT}$ and/or at a desired duty cycle.

Figure 3B:
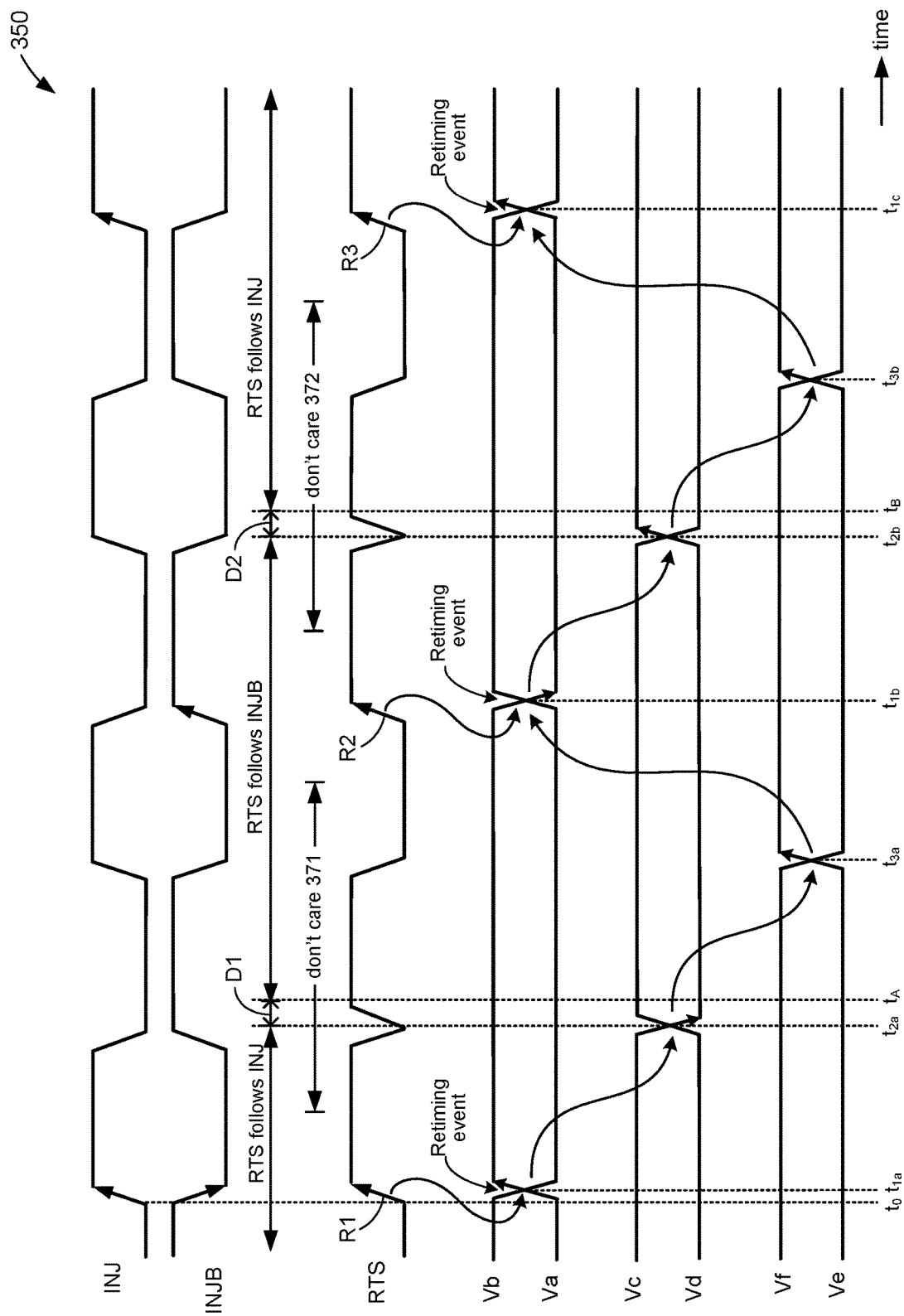
FIG. 3B is an example timing diagram for signals generated by the frequency divider of FIG. 3A, in accordance with some embodiments.

FIG. 3B is an example timing diagram 350 for signals generated by the frequency divider 300 of FIG. 3A when configured to operate as a divide-by-3 frequency divider, in accordance with some embodiments. Prior to time $t_0$, the injection signal INJ is logic low, the complementary injection signal INJB is logic high, the retiming signal RTS is logic low, signal Va is logic low and signal Vb is logic high, signal Vc is logic high and signal Vd is logic low, and signal Ve is logic low and signal Vf is logic high. Thus, prior to time $t_0$, the first oscillation waveform OSC_1 appearing at the first oscillator stage is in the logic low state, the second oscillation waveform OSC_2 appearing at the second oscillator stage is in the logic high state, and the third oscillation waveform OSC_3 appearing at the third oscillator stage is in the logic low state.

At time $t_0$, the input signal $V_{IN}$ begins to transition from logic low to logic high, with a midpoint of the rising edge of INJ occurring just after time $t_0$ and a midpoint of the falling edge of INJB occurring just after time $t_0$. In response to the logic high state of signal Vc (and/or the logic low state of signal Vd) at time $t_{1a}$, the MUX M1 selects the injection signal INJ to provide as the retiming signal RTS to the switch 320, for example, such that the waveform of RTS follows the waveform of INJ. The rising edge R1 of RTS just before time $t_{1a}$ closes the switch 320 and couples the oscillator nodes N1-N2 together, which may assist the logic state transitions of signals Va-Vb at time $t_{1a}$. As shown in FIG. 3B, the rising edge R1 of RTS occurs sufficiently close in time $t_0$ the logic state transitions of signals Va-Vb at time $t_{1a}$ to qualify as a retiming event, and thus the injection provided by MUX M1 may alter timing aspects of the signals Va-Vb in a manner that may re-time the first oscillation waveform OSC_1 at time $t_{1a}$.

The logic state transitions of signals Va-Vb at time $t_{1a}$ propagate through the second differential amplifier 312 and cause logic state transitions of signals Vc-Vd at time $t_{2a}$, which in turn propagate through the third differential amplifier 313 and cause logic state transitions of signals Ve-Vf at time $t_{3a}$. The time period between times $t_{1a}$ and $t_{2a}$ may be indicative of a propagation delay of the second differential amplifier 312, and the time period between times $t_{2a}$ and $t_{3a}$ may be indicative of a propagation delay of the third differential amplifier 313.

The waveform of the retiming signal RTS may follow the waveform of INJ until the logic state transitions of signals Vc-Vd at approximately time $t_{2a}$. Specifically, in response to the logic high-to-low transition of signal Vc (and/or the logic low-to-high transition of signal Vd) at time $t_{2a}$, MUX M1 selects the complementary injection signal INJB to provide as the retiming signal RTS to the switch 320, for example, such that the waveform of RTS begins following the waveform of the complementary injection signal INJB by time $t_A$. In some aspects, the time period between times $t_{2a}$ and $t_A$ may correspond to propagation delays associated with the MUX M1. Although the rising edge of RTS just after time $t_{2a}$ may close the switch 320, it is not sufficiently close in time with any logic state transitions of signals Va-Vb to qualify as a retiming event.

More specifically, because the on-resistance of the switch 320 is relatively high compared with the output impedance of the first differential amplifier 311, closing the switch 320 just after time $t_{2a}$ based on the rising edge of RTS may not alter the logic states of signals Va-Vb. In some implementations, indeterminate logic states and/or glitches in the retiming signal RTS may not affect timing aspects of the first oscillation waveform (OSC_1) for a duration of time 371 beginning at approximately the mid-point between logic state transitions of signals Va/Vb and signals Vc/Vd and ending at approximately the mid-point between logic state transitions of signals Ve/Vf and signals Va/Vb, for example, as long as the waveform of the retiming signal RTS follows either the waveform of the injection signal INJ or follows the waveform of the complementary input signal INJB.

The rising edge R2 of RTS just before time $t_{1b}$ closes the switch 320 and couples the oscillator nodes N1-N2 together, which may assist the logic state transitions of signals Va-Vb at time $t_{1b}$. As shown in FIG. 3B, the rising edge R2 of RTS occurs sufficiently close in time $t_0$ the logic state transitions of signals Va-Vb at time $t_{1b}$ to qualify as a retiming event, and thus the injection provided by MUX M1 may alter timing aspects of the signals Va-Vb in a manner that re-times the oscillation waveform (OSC_1) at approximately time $t_{1b}$.

Because the retiming event at time $t_{1b}$ coincides with a falling edge of INJ, using the falling edge of INJ to re-time the oscillator 310 may result in an amount of injection that is different than the injection associated with the retiming event at time $t_{1a}$, which may undesirably lead to drift and/or jitter. Accordingly, by triggering oscillator injections using the retiming signal RTS (rather than the rising edges of the input signal $V_{IN}$), the frequency divider 300 may provide an oscillator injection at every logic state transition of the oscillation waveform appearing at the oscillator nodes N1-N2, even when the rising edges (or the falling edges) of INJ are not aligned with the logic state transitions of the oscillation waveform.

The logic state transitions of signals Va-Vb at time $t_{1b}$ propagate through the second differential amplifier 312 and cause logic state transitions of signals Vc-Vd at time $t_{2b}$, which in turn propagate through the third differential amplifier 313 and cause logic state transitions of signals Ve-Vf at time $t_{3b}$. The time period between times $t_{1b}$ and tea may be indicative of the propagation delay of the second differential amplifier 312, and the time period between times $t_{2b}$ and $t_{3b}$ may be indicative of the propagation delay of the third differential amplifier 313.

The waveform of the retiming signal RTS may follow the waveform of INJB until the logic state transitions of signals Vc-Vd at approximately time $t_{2b}$. Specifically, in response to the logic low-to-high transition of signal Vc (and/or the logic high-to-low transition of signal Vd) at time $t_{2b}$, MUX M1 selects the injection signal INJ to provide as the retiming signal RTS to the switch 320, for example, such that the waveform for RTS begins following the waveform of INJ by time $t_B$. Although the rising edge of RTS just after time $t_{2b}$ may close the switch 320, it is not sufficiently close in time with any logic state transitions of signals Va-Vb to qualify as a retiming event. As a result, the rising edge of RTS just after time $t_{2b}$ may not inadvertently affect timing aspects of the oscillation waveform. In some implementations, indeterminate logic states and/or glitches in the retiming signal RTS may not affect timing aspects of the oscillation waveform for a duration of time 372 beginning at approximately the mid-point between logic state transitions of signals Va/Vb and signals Vc/Vd and ending at approximately the mid-point between logic state transitions of signals Ve/Vf and signals Va/Vb, for example, as long as the waveform of the retiming signal RTS follows either the waveform of the input signal INJ or the waveform of the complementary input signal INJB (e.g., prior to a subsequent logic state transition of signals Va-Vb).

The rising edge R3 of RTS just before time $t_{1c}$ closes the switch 320 and couples the oscillator nodes N1-N2 together, which in turn may assist the logic state transitions of signals Va-Vb at time $t_{1c}$. As shown in FIG. 3B, the rising edge R3 of RTS occurs sufficiently close in time $t_0$ the logic state transitions of signals Va-Vb at time $t_{1c}$ to qualify as a retiming event, and thus the injection provided by MUX M1 may alter timing aspects of the signals Va-Vb in a manner that may re-time the oscillation waveform at time $t_{1c}$.

The frequency divider 300 of FIG. 3A may provide several advantages over other frequency dividers (such as the frequency divider 100 of FIG. 1A and the frequency divider 200 of FIG. 2A). For example, the frequency divider 300 may provide a relatively constant level of injection to the oscillator nodes N1-N2 for each logic state transition of the oscillation waveform appearing at the oscillator nodes N1-N2 without alignment between the rising edges of the input signal and the oscillation waveform. As a result, the switch 320 may be used to apply the injection to the oscillator nodes N1-N2. Moreover, various aspects of the present disclosure may be applied to multi-point injection embodiments in which an input current may be injected into multiple stages of the oscillator, for example, to provide a relatively constant level of injection to the multiple stages for each logic state transition of the oscillation waveform without aligning rising edges of the input signal with the oscillation waveform.

Figure 4:
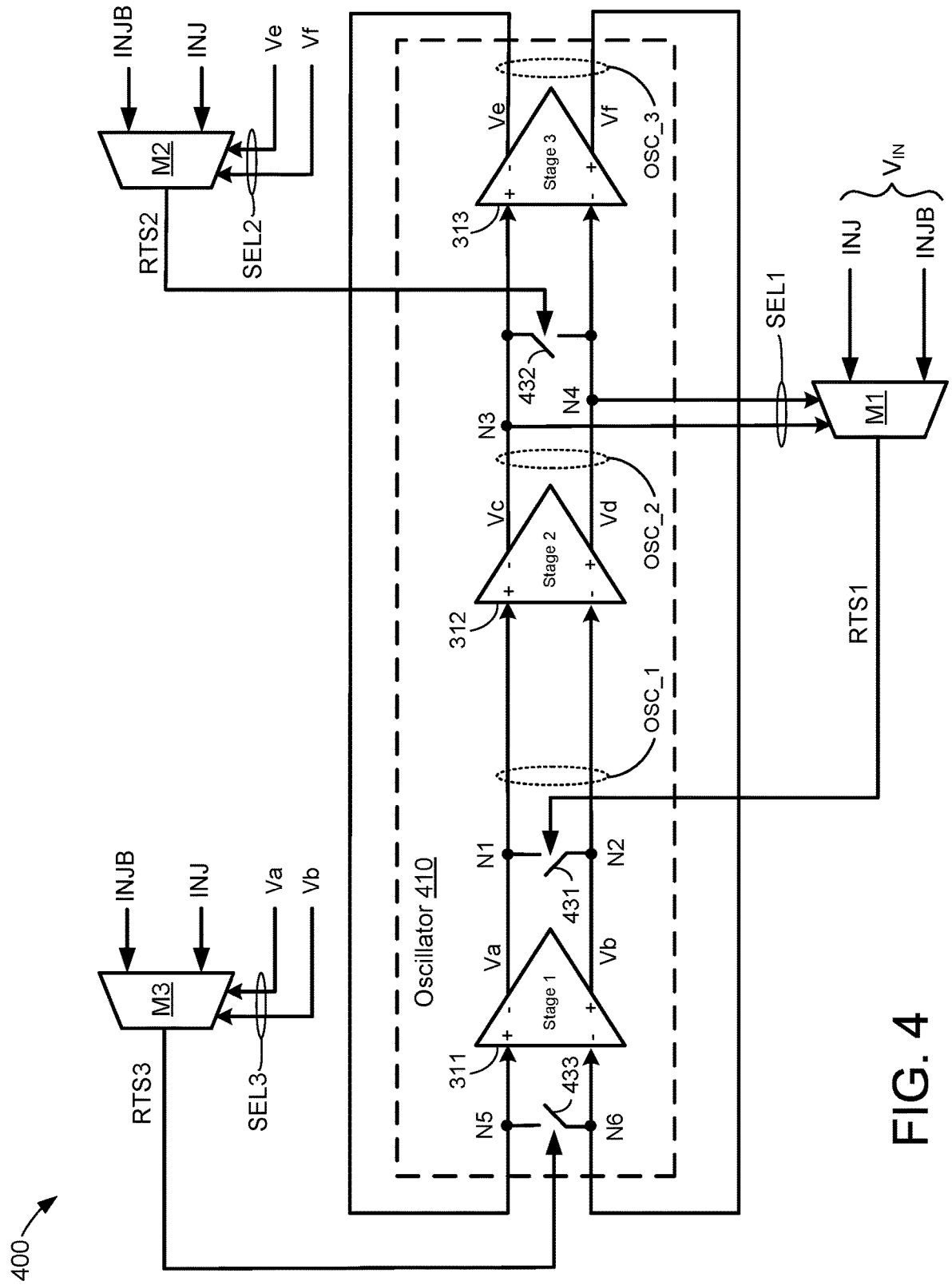
FIG. 4 is a block diagram of another example frequency divider, in accordance with some embodiments.

In other implementations, the injection techniques described with respect to FIG. 3A may be applied to multiple stages of an oscillator. For example, FIG. 4 is a block diagram of another example frequency divider 400, in accordance with some embodiments. The frequency divider 400 is shown to include an oscillator 410, switches 431-433, the buffer circuit 330, and MUXs M1-M3. The oscillator 410, which is shown as a 3-stage ring oscillator formed by the first differential amplifier 311, the second differential amplifier 312, and the third differential amplifier 313, may be configured to oscillate at a desired frequency. The stages of the oscillator 410 are depicted as including differential amplifiers 311-313 for illustrative purposes only. In other implementations, any suitable delay elements (such as buffers, inverters, or delay circuits) may be used to form the oscillator 410. Therefore, in some aspects, each of the differential amplifiers 311-313 of the oscillator 410 may also be referred to herein as a delay element or a delay stage. Further, although the oscillator 410 is described herein with respect to differential signaling, aspects of the present disclosure are equally applicable to oscillators and/or frequency dividers that employ single-ended signaling.

The first differential amplifier 311 may generate a first oscillation waveform (OSC_1) represented by a first pair of oscillation signals Va-Vb, and may correspond to the first stage of the oscillator 410. The second differential amplifier 312 may generate a second oscillation waveform (OSC_2) represented by a second pair of oscillation signals Vc-Vd, and may correspond to the second stage of the oscillator 410. The third differential amplifier 313 may generate a third oscillation waveform (OSC_3) represented by a third pair of oscillation signals Ve-Vf, and may correspond to the third stage of the oscillator 410. Thus, in some aspects, the oscillation signals Va-Vb may be a differential representation of the first oscillation waveform (OSC_1) appearing at the first stage of the oscillator 410, the oscillation signals Vc-Vd may be a differential representation of the second oscillation waveform (OSC_2) appearing at the second stage of the oscillator 410, and the oscillation signals Ve-Vf may be a differential representation of the third oscillation waveform (OSC_3) appearing at the third stage of the oscillator 410.

In some implementations, the frequency divider 400 may be configured to operate as a divide-by-3 frequency divider that generates an output signal $V_{OUT}$ having a frequency equal to one-third the frequency of an input signal $V_{IN}$ (such as $f_{OUT}=f_{IN}/3$). The oscillator 410 may be tuned to the desired output frequency $f_{OUT}$, for example, such that the first oscillation waveform (OSC_1) appearing at the first oscillator stage may have a frequency equal (or at least substantially equal) to $f_{OUT}$, the second oscillation waveform (OSC_2) appearing at the second oscillator stage may have a frequency equal (or at least substantially equal) to $f_{OUT}$, and the third oscillation waveform (OSC_3) appearing at the first oscillator stage may have a frequency equal (or at least substantially equal) to $f_{OUT}$. Further, although depicted in FIG. 4 as including 3 delay stages, the frequency divider 400 may, in other embodiments, operate as a divide-by-3 frequency divider using a number M of delay stages coupled in series with each other, where M may be an integer multiple of 3. In some other embodiments, the frequency divider 400 may be configured to operate as a divide-by-N frequency divider that generates an output signal $V_{OUT}$ having a frequency equal to 1/N times the frequency of the input signal $V_{IN}$ (such as $f_{OUT}=f_{IN}/N$).

The buffer circuit 330 includes inputs to receive the first oscillation waveform (OSC_1) via oscillator nodes N1-N2, and includes an output to provide the output signal $V_{OUT}$. Although the output signal $V_{OUT}$ is shown as a single-ended signal for the example of FIG. 4, in other implementations, the output signal $V_{OUT}$ may be a differential signal. In addition, or in the alternative, the second oscillation waveform (OSC_2) may be used via oscillator nodes N3-N4 to provide or generate a second output signal. This second output signal may have the same frequency and duty cycle as the output signal $V_{OUT}$ formed by signals Va-Vb, and may be offset from the output signal $V_{OUT}$ by, for example, 120 degrees. In a similar manner, the third oscillation waveform (OSC_3) may be used via oscillator nodes N5-N6 to provide or generate a third output signal. This third output signal may have the same frequency and duty cycle as the output signal $V_{OUT}$ provided by signals Va-Vb, and may be offset from the output signal $V_{OUT}$ by, for example, 240 degrees. In this manner, the frequency divider 400 may provide a multi-phased output signal having a frequency equal to one-third the frequency of the input signal $V_{IN}$.

The first switch 431 is coupled between oscillator nodes N1 and N2, and includes a control terminal to receive a first retiming signal (RTS1). The first switch 431 may be any suitable coupling circuit or device capable of selectively coupling the oscillator nodes N1-N2 together (or otherwise adjusting an impedance between the oscillator nodes N1-N2) based on a logic state of RTS1. In some implementations, the coupling circuit (e.g., the first switch 431) may be configured to adjust its drive strength, its series resistance, and/or other suitable operating characteristics based on one or more control signals (not shown for simplicity). For the example embodiments described herein, a logic high state and/or a rising edge of RTS1 may close the first switch 431 at retiming events to alter timing aspects of the oscillator 410, and a logic low state and/or a falling edge of RTS1 may open the first switch 431 in an absence of retiming events to isolate the oscillator nodes N1-N2 from each other. For other embodiments, the falling edge of RTS may close the first switch 431 at retiming events, and the rising edge of RTS may open the first switch 431 in an absence of retiming events.

The second switch 432 is coupled between oscillator nodes N3 and N4, and includes a control terminal to receive a second retiming signal (RTS2). The second switch 432 may be any suitable coupling circuit or device capable of selectively coupling the oscillator nodes N3-N4 together (or otherwise adjusting an impedance between the oscillator nodes N3-N4) based on a logic state of RTS2. In some implementations, the coupling circuit (e.g., the second switch 432) may be configured to adjust its drive strength, its series resistance, and/or other suitable operating characteristics based on one or more control signals (not shown for simplicity). For the example embodiments described herein, a logic high state and/or a rising edge of RTS2 may close the second switch 432 at retiming events to alter timing aspects of the oscillator 410, and a logic low state and/or a falling edge of RTS2 may open the second switch 432 in an absence of retiming events to isolate the oscillator nodes N3-N4 from each other. For other embodiments, the falling edge of RTS2 may close the second switch 432 at retiming events, and the rising edge of RTS2 may open the second switch 432 in an absence of retiming events.

The third switch 433 is coupled between oscillator nodes N5 and N6, and includes a control terminal to receive a third retiming signal (RTS3). The third switch 433 may be any suitable coupling circuit or device capable of selectively coupling the oscillator nodes N5-N6 together (or otherwise adjusting an impedance between the oscillator nodes N5-N6) based on a logic state of RTS3. In some implementations, the coupling circuit (e.g., the switch 433) may be configured to adjust its drive strength, its series resistance, and/or other suitable operating characteristics based on one or more control signals (not shown for simplicity). For the example embodiments described herein, a logic high state and/or a rising edge of RTS3 may close the third switch 433 at retiming events to alter timing aspects of the oscillator 410, and a logic low state and/or a falling edge of RTS3 may open the third switch 433 in an absence of retiming events to isolate the oscillator nodes N5-N6 from each other. For other embodiments, the falling edge of RTS3 may close the third switch 433 at retiming events, and the rising edge of RTS3 may open the third switch 433 in an absence of retiming events.

The first MUX M1 may include inputs to receive the injection signal INJ and the complementary injection signal INJB, control terminals coupled to receive a first select signal (SEL1) provided by the second oscillation waveform (OSC_2) via respective nodes N3-N4 of the oscillator 410, and an output to provide the first retiming signal RTS1 to the first switch 431. In some implementations, the first MUX M1 may select either the injection signal INJ or the complementary injection signal INJB to provide as the first retiming signal RTS1 to the first switch 431 based the logic state of the second oscillation waveform (OSC_2). In response to the logic state of RTS1, the first switch 431 may selectively couple the oscillator nodes N1-N2 together and thereby alter the timing of the first oscillation waveform (OSC_1) appearing at the first oscillator stage. In other implementations, the first select signal SEL1 may be formed or provided by an oscillation waveform appearing at another suitable stage of the oscillator 410. For example, in some aspects, the first select signal SEL1 may be formed by the third oscillation waveform (OSC_3) appearing at respective nodes N5-N6 of the oscillator 410.

The logic state of RTS1, which may be based on a combination of the second oscillation waveform (OSC_2) represented by oscillator signals Vc-Vd and the input signal $V_{IN}$, may be used to re-time the oscillator 410 at the oscillator nodes N1-N2. For example, a logic high state of SEL1 may cause MUX M1 to provide the injection signal INJ as the first retiming signal RTS1 to the first switch 431, and a logic low state of SEL1 may cause MUX M1 to provide the complementary injection signal INJB as the first retiming signal RTS1 to the first switch 431. In some aspects, the MUX M1 may be configured to alternate between providing the injection into the first oscillator stage based on rising edges of the input signal and providing the injection into the first oscillator stage based on falling edges of the input signal in response to the logic state of the second oscillation waveform (OSC_2) appearing at the second oscillator stage. In this manner, the MUX M1 may sequentially alternate between triggering the injection into the first oscillator stage based on rising edges of the input signal and triggering the injection into the first oscillator stage based on falling edges of the input signal. As a result, the first MUX M1 may provide a consistent amount of injection to the oscillator nodes N1-N2 during every period of the first oscillation waveform (OSC_1) appearing at oscillator nodes N1-N2.

The second MUX M2 may include inputs to receive the injection signal INJ and the complementary injection signal INJB, control terminals coupled to receive a second select signal (SEL2) provided by the third oscillation waveform (OSC_3) via respective nodes N5-N6 of the oscillator 410, and an output to provide the second retiming signal RTS2 to the second switch 432. In some implementations, the second MUX M2 may select either the complementary injection signal INJB or the injection signal INJ to provide as the second retiming signal RTS2 to the second switch 432 based the logic states of the third oscillation waveform (OSC_3). In response to the logic state of RTS2, the second switch 432 may selectively couple the oscillator nodes N3-N4 together and thereby alter the timing of the second oscillation waveform (OSC_2) appearing at the second oscillator stage. In other implementations, the second select signal SEL2 may be formed or provided by an oscillation waveform appearing at another suitable stage of the oscillator 410. For example, in some aspects, the second signal SEL2 may be formed by the first oscillation waveform (OSC_1) appearing at the first oscillator stage.

The logic state of RTS2, which may be based on a combination of the second oscillation waveform (OSC_2) represented by oscillator signals Ve-Vf and the input signal $V_{IN}$, may be used to re-time the oscillator 410 at the oscillator nodes N3-N4. For example, a logic high state of SEL2 may cause MUX M2 to provide the injection signal INJ as the second retiming signal RTS2 to the second switch 432, and a logic low state of SEL2 may cause MUX M2 to provide the complementary injection signal INJB as the second retiming signal RTS2 to the second switch 432. In some aspects, the MUX M2 may be configured to alternate between providing the injection into the second oscillator stage based on rising edges of the input signal and providing the injection into the second oscillator stage based on falling edges of the input signal in response to the logic state of the third oscillation waveform appearing at the third oscillator stage. In this manner, the MUX M2 may sequentially alternate between triggering the injection into the second oscillator stage based on rising edges of the input signal and triggering the injection into the second oscillator stage based on falling edges of the input signal. As a result, the second MUX M2 may provide a consistent amount of injection to the oscillator nodes N3-N4 during every period of the second oscillation waveform (OSC_2) appearing at the second oscillator stage.

The third MUX M3 may include inputs to receive the injection signal INJ and the complementary injection signal INJB, control terminals coupled to receive a third select signal (SEL3) provided by the first oscillation waveform (OSC_1) via respective nodes N1-N2 of the oscillator 410, and an output to provide the third retiming signal RTS3 to the third switch 433. In some implementations, the third MUX M3 may select either the logically complemented injection signal INJB or the injection signal INJ to provide as the third retiming signal RTS3 to the third switch 433 based on the logic state of the first oscillation waveform (OSC_1). In response to the logic state of RTS3, the third switch 433 may selectively couple the oscillator nodes N5-N6 together and thereby alter the timing of the oscillation waveform appearing at the third oscillator stage. In other implementations, the third select signal SEL3 may be formed or provided by an oscillation waveform appearing at another suitable stage of the oscillator 410. For example, in some aspects, the third select signal SEL3 may be formed by the second oscillation waveform (OSC_1) appearing at the second oscillator stage.

The logic state of RTS3, which may be based on a combination of the oscillator signals Va-Vb and the input signal $V_{IN}$, may be used to re-time the oscillator 410 at the oscillator nodes N5-N6. For example, a logic high state of SEL3 may cause MUX M3 to provide the injection signal INJ as the third retiming signal RTS3 to the third switch 433, and a logic low state of SEL3 may cause MUX M3 to provide the complementary injection signal INJB as the third retiming signal RTS3 to the third switch 433. In some aspects, the MUX M3 may be configured to alternate between providing the injection into the third oscillator stage based on rising edges of the input signal and providing the injection into the third oscillator stage based on falling edges of the input signal in response to the logic state of the first oscillation waveform appearing at the first oscillator stage. In this manner, the MUX M3 may sequentially alternate between triggering the injection into the third oscillator stage based on rising edges of the input signal and triggering the injection into the third oscillator stage based on falling edges of the input signal. As a result, the third MUX M3 may provide a consistent amount of injection to the oscillator nodes N5-N6 during every period of the third oscillation waveform (OSC_3) appearing at the third oscillator stage.

As mentioned above, the MUXes M1-M3 may be any suitable logic that selects one of the signals INJ and INJB based on the logic state of an oscillation waveform appearing at another stage of the oscillator 310. In some embodiments, one or more of the MUXes M1-M3 may include internal buffering, external buffering, and/or a number of programmable characteristics (such as drive strength) that may be used to avoid loading the oscillation nodes, to dynamically adjust signal propagation delays, and to dynamically adjust drive strengths.

As described above, the polarity of the input signals provided to the second and third MUXes M2-M3 are reversed with respect to the input signals provided to the first MUX M1. More specifically, while a logic high state of SEL1 may cause the first MUX M1 to inject the input signal INJ into the oscillator 410, a logic high state of SEL2 may cause the second MUX M2 to inject the logically complemented input signal INJB into the oscillator 410, and a logic high state of SEL3 may cause the third MUX M3 to inject the logically complemented input signal INJB into the oscillator 410. Conversely, while a logic low state of SEL1 may cause the first MUX M1 to inject the logically complemented input signal INJB into the oscillator 410, a logic low state of SEL2 may cause the second MUX M2 to inject the input signal INJ into the oscillator 410, and a logic low state of SEL3 may cause the third MUX M3 to inject the input signal INJ into the oscillator 410.

Figure 5A:
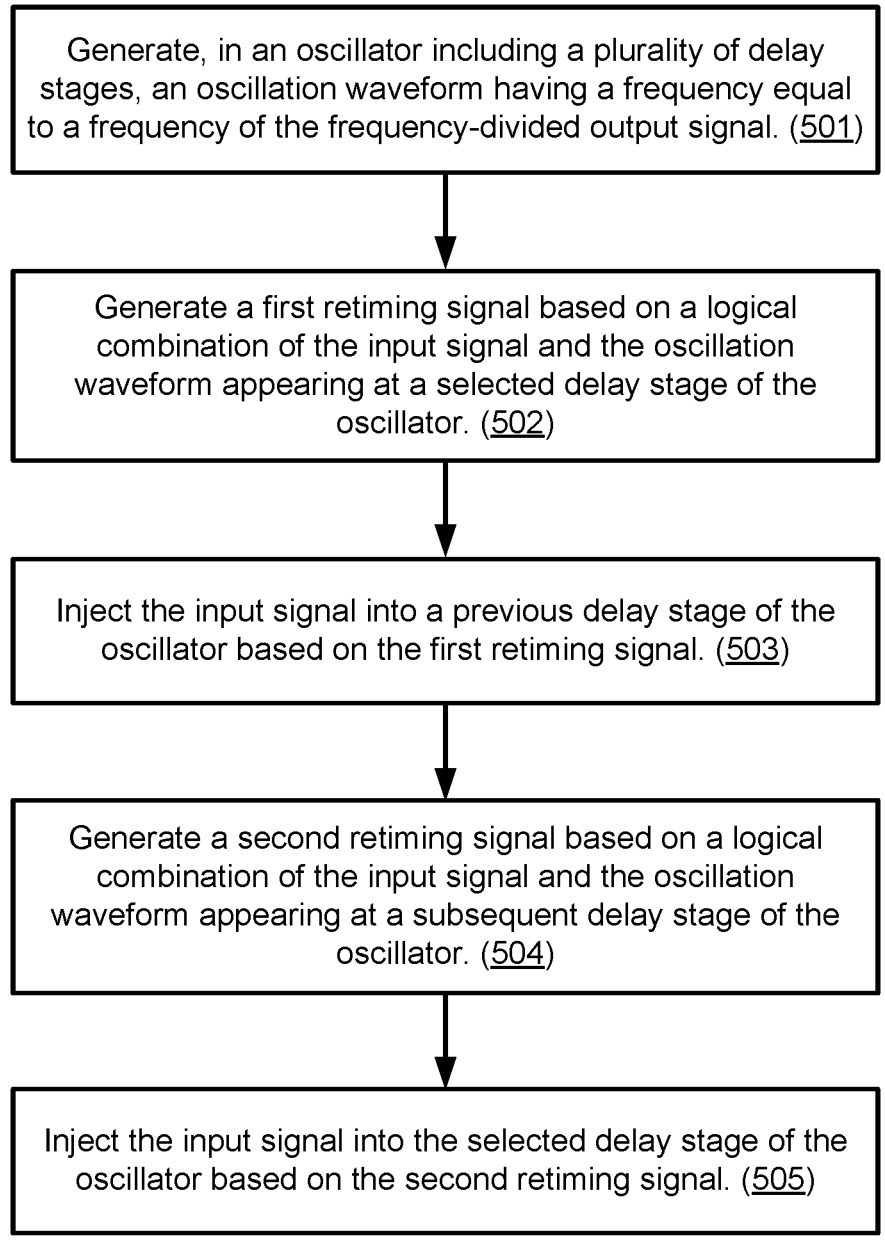
FIG. 5A is an illustrative flow chart depicting an example operation for performing a frequency division operation, in accordance with some embodiments.

FIG. 5A is an illustrative flowchart depicting an example operation 500 for generating a frequency-divided signal, according to the example embodiments. Although described herein with respect to the frequency divider 400 of FIG. 4, the example operation 500 may be performed by the frequency divider 300 of FIG. 3A, or any other suitable frequency divider.

The frequency divider 400 may generate, in an oscillator 410 including a plurality of delay stages, an oscillation waveform having a frequency equal to a frequency of the frequency-divided output signal (501). For example, referring also to FIG. 4, the frequency divider 400 may generate an oscillation waveform that propagates through the delay stages of the oscillator 410. The oscillation waveform may have a frequency equal to 1/N time the frequency of the input signal ($V_{IN}$), where N is an integer greater than one. In some embodiments, the frequency divider 400 may be configured to operate as a divide-by-3 frequency divider that generates an output signal $V_{OUT}$ having a frequency equal to one-third the frequency of an input signal $V_{IN}$ (such as $f_{OUT}=f_{IN}/3$).

The frequency divider 400 may generate a first retiming signal RTS1 based on a logical combination of the input signal (INJ) and the oscillation waveform (OSC) appearing at a selected delay stage of the oscillator (502). Referring also to FIG. 4, in some implementations, the MUX M1 may select either the input signal INJ or the complementary input signal INJB to provide as the first retiming signal RTS1 to the first switch 431 based on the logic state of the second oscillation waveform (OSC_2) appearing at the second oscillator stage. In some aspects, the MUX M1 may be configured to alternate between providing the injection into the first oscillator stage based on rising edges of the input signal INJ and providing the injection into the first oscillator stage based on falling edges of the input signal INJ in response to the logic state of the second oscillation waveform (OSC_2) appearing at the second oscillator stage. In this manner, the MUX M1 may sequentially alternate between triggering the injection into the first oscillator stage based on rising edges of the input signal INJ and triggering the injection into the first oscillator stage based on falling edges of the input signal INJ.

The frequency divider 400 may inject the input signal into a previous delay stage of the oscillator 410 based on the first retiming signal RTS1 (503). Referring also to FIG. 4, in some implementations, the first retiming signal RTS1 may be used to re-time the oscillator 410 at the oscillator nodes N1-N2.

In some embodiments, the frequency divider 400 may generate a second retiming signal RTS2 based on a logical combination of the input signal INJ and the oscillation waveform (OSC) appearing at a subsequent delay stage of the oscillator 410 (504), and may inject the input signal INJ into the selected delay stage of the oscillator 410 based on the second retiming signal RTS2 (505).

Figure 5B:
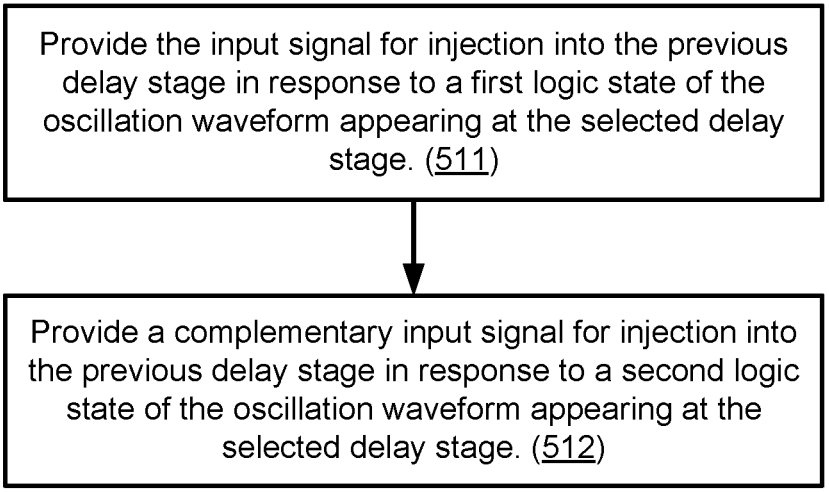
FIG. 5B is an illustrative flow chart depicting an example operation for providing an input signal for injection into an oscillator of a frequency divider, in accordance with some embodiments.

FIG. 5B is an illustrative flow chart depicting an example operation 510 for providing an input signal for injection into an oscillator, in accordance with some embodiments. Although described herein with respect to the frequency divider 400 of FIG. 4, the example operation 510 may be performed by the frequency divider 300 of FIG. 3A, or any other suitable frequency divider. In some embodiments, the example operation 510 may be one embodiment of block 503 of FIG. 5A.

The frequency divider 400 may provide the input signal for injection into the previous delay stage in response to a first logic state of the oscillation waveform appearing at the selected delay stage (511), and may provide a complementary input signal for injection into the previous delay stage in response to a second logic state of the oscillation waveform appearing at the selected delay stage (512).

Figure 5C:
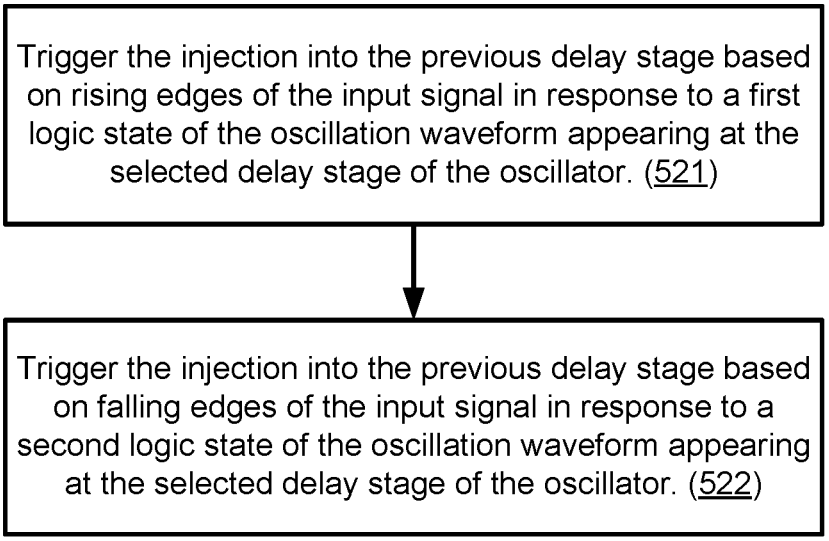
FIG. 5C is an illustrative flow chart depicting an example operation for triggering an injection into an oscillator of a frequency divider, in accordance with some embodiments.

FIG. 5C is an illustrative flow chart depicting an example operation 520 for triggering injection into an oscillator, in accordance with some embodiments. Although described herein with respect to the frequency divider 400 of FIG. 4, the example operation 520 may be performed by the frequency divider 300 of FIG. 3A, or any other suitable frequency divider. In some embodiments, the example operation 520 may be one embodiment of block 503 of FIG. 5A.

The frequency divider 400 may trigger the injection into the previous delay stage based on rising edges of the input signal in response to a first logic state of the oscillation waveform appearing at the selected delay stage of the oscillator (521), and may trigger the injection into the previous delay stage based on falling edges of the input signal in response to a second logic state of the oscillation waveform appearing at the selected delay stage of the oscillator (522).

Figure 6:
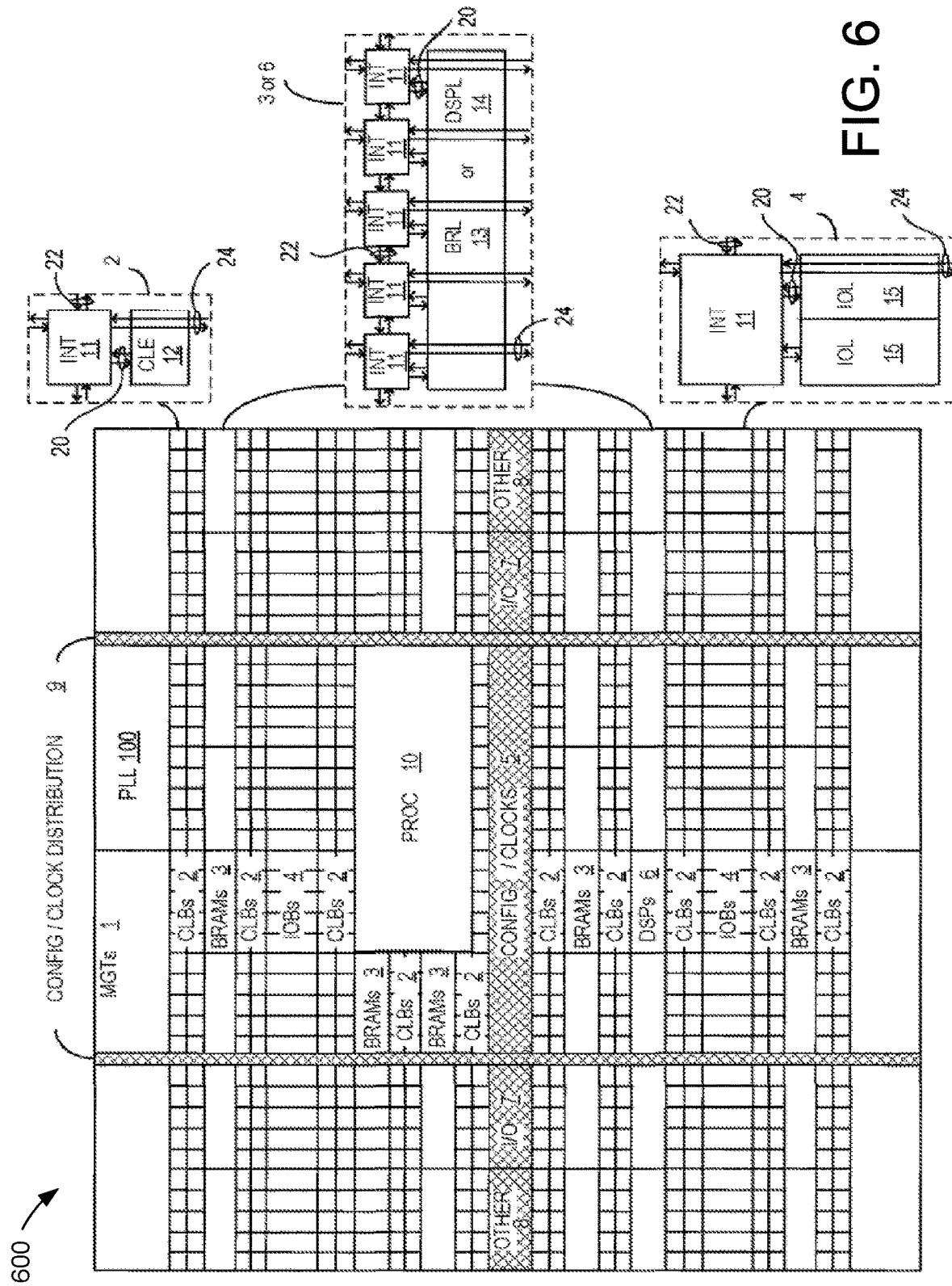
FIG. 6 illustrates an architecture of an example field programmable gate array (FPGA) within which the embodiments disclosed herein may be implemented.

FIG. 6 illustrates an architecture of an FPGA 600 that includes a number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 6. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 6) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A frequency divider configured to generate an output signal having a frequency equal to 1/N times the frequency of an input signal, wherein N is an integer greater than one, the frequency divider comprising:
   an oscillator comprising a plurality of delay elements coupled in series with each other;
   a first coupling circuit coupled to a first oscillator node and including a control terminal to receive a first retiming signal; and
   a first multiplexer including inputs coupled to receive the input signal and a complementary input signal, a control terminal coupled to a second oscillator node, and an output to provide the first retiming signal.

2. The frequency divider of claim 1, wherein each of the plurality of delay elements comprises a differential amplifier, wherein N is an integer greater than one, wherein the oscillator includes a number M of delay elements, and wherein M is equal to N or comprises an integer multiple of N.

3. The frequency divider of claim 1, wherein the first multiplexer is configured to alternate between injecting the input signal into the first oscillator node based on rising edges of the input signal and injecting the input signal into the first oscillator node based on falling edges of the input signal in response to a logic state of an oscillation waveform appearing at the second oscillator node.

4. The frequency divider of claim 1, wherein the first oscillator node is coupled to receive a first oscillation waveform provided by a first delay element, the second oscillator node is coupled to receive a second oscillation waveform provided by a second delay element, and the first coupling circuit is configured to re-time the first oscillation waveform based on a logical combination of the second oscillation waveform, the input signal, and the complementary input signal.

5. The frequency divider of claim 4, further comprising:
   a second coupling circuit coupled to the second oscillator node and including a control terminal to receive a second retiming signal; and
   a second multiplexer including inputs coupled to receive the input signal and the complementary input signal, a control terminal coupled to a third oscillator node, and an output to provide the second retiming signal.

6. The frequency divider of claim 5, wherein the second oscillator node is coupled to receive the second oscillation waveform provided by the second delay element, the third oscillator node is coupled to receive a third oscillation waveform provided by a third delay element, and the second coupling circuit is configured to re-time the second oscillation waveform based on a logical combination of the third oscillation waveform, the input signal, and the complementary input signal.

7. The frequency divider of claim 6, further comprising:
   a third coupling circuit coupled to the third oscillator node and including a control terminal to receive a third retiming signal; and
   a third multiplexer including inputs coupled to receive the input signal and the complementary input signal, a control terminal coupled to the first oscillator node, and an output to provide the third retiming signal.

8. The frequency divider of claim 7, wherein the third oscillator node is coupled to receive the third oscillation waveform provided by the third delay element, the first oscillator node is coupled to receive the first oscillation waveform provided by the first delay element, and the third coupling circuit is configured to re-time the third oscillation waveform based on a logical combination of the first oscillation waveform, the input signal, and the complementary input signal.

9. A frequency divider configured to frequency-divide an input signal to generate a frequency-divided output signal, the frequency divider comprising:
   a ring oscillator including a plurality of delay stages;
   a first coupling circuit configured to inject the input signal into a first delay stage of the plurality of delay stages based on a first retiming signal; and
   first logic configured to generate the first retiming signal based on a logical combination of the input signal and an oscillation waveform appearing at a second delay stage of the plurality of delay stages, and further configured to sequentially alternate between triggering the injection of the input signal into the first delay stage based on rising edges of the input signal and triggering the injection of the input signal into the first delay stage based on falling edges of the input signal.

10. The frequency divider of claim 9, wherein each of the plurality of delay stages comprises a differential amplifier including an inverted input coupled to a non-inverted output of a previous delay stage, a non-inverted input coupled to an inverted output of the previous delay stage, an inverted output coupled to a non-inverted input of a next delay stage, and a non-inverted output coupled to an inverted input of the next delay stage.

11. The frequency divider of claim 9, wherein the first logic comprises a multiplexer including a first input to receive the input signal, a second input to receive a complementary input signal, a control terminal coupled to the second delay stage, and an output to provide the first retiming signal to the first coupling circuit.

12. The frequency divider of claim 9, wherein the first logic is configured to:
   provide the input signal as the injection to the first delay stage when the oscillation waveform appearing at the second delay stage is in a first logic state; and
   provide a complementary input signal as the injection to the first delay stage when the oscillation waveform appearing at the second delay stage is in a second logic state.

13. The frequency divider of claim 9, further comprising:
   a second coupling circuit configured to inject the input signal into the second delay stage based on a second retiming signal; and
   second logic configured to generate the second retiming signal based on a logical combination of the input signal and an oscillation waveform appearing at a third delay stage of the plurality of delay stages.

14. The frequency divider of claim 13, wherein the second logic comprises a multiplexer including a first input to receive the input signal, a second input to receive a complementary input signal, a control terminal coupled to the third delay stage, and an output to provide the second retiming signal to the second coupling circuit.

15. A method for frequency-dividing an input signal to generate a frequency-divided output signal, the method comprising:
   generating, in an oscillator including a plurality of delay stages, an oscillation waveform having a frequency equal to a frequency of the frequency-divided output signal;
   generating a first retiming signal based on a logical combination of the input signal and the oscillation waveform appearing at a selected delay stage of the oscillator; and
   injecting the input signal into a previous delay stage of the oscillator based on the first retiming signal by:
      providing the input signal for injection into the previous delay stage in response to a first logic state of the oscillation waveform appearing at the selected delay stage; and
      providing a complementary input signal for injection into the previous delay stage in response to a second logic state of the oscillation waveform appearing at the selected delay stage.

16. The method of claim 15, wherein the first retiming signal is configured to alternate between triggering the injection into the previous delay stage based on rising edges of the input signal and triggering the injection into the previous delay stage based on falling edges of the input signal in response to a logic state of the oscillation waveform appearing at the selected delay stage.

17. The method of claim 15, further comprising:
   generating a second retiming signal based on a logical combination of the input signal and the oscillation waveform appearing at a subsequent delay stage of the oscillator; and
   injecting the input signal into the selected delay stage of the oscillator based on the second retiming signal.

18. The method of claim 17, wherein the second retiming signal is configured to alternate between triggering the injection into the selected delay stage based on rising edges of the input signal and triggering the injection into the selected delay stage based on falling edges of the input signal in response to a logic state of the oscillation waveform appearing at the subsequent delay stage.

* * * * *